(12) United States Patent
Usami et al.

(10) Patent No.: US 10,373,663 B2
(45) Date of Patent: Aug. 6, 2019

(54) NON-VOLATILE MEMORY CIRCUIT

(71) Applicant: SONY CORPORATION, Tokyo (JP)

(72) Inventors: Kimiyoshi Usami, Kanagawa (JP); Masaru Kudo, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 15/572,580

(22) PCT Filed: May 2, 2016

(86) PCT No.: PCT/JP2016/063536
§ 371 (c)(1),
(2) Date: Nov. 8, 2017

(87) PCT Pub. No.: WO2016/185903
PCT Pub. Date: Nov. 24, 2016

(65) Prior Publication Data
US 2018/0158500 A1    Jun. 7, 2018

(30) Foreign Application Priority Data
May 15, 2015  (JP) ................... 2015-099631

(51) Int. Cl.
*G11C 11/00* (2006.01)
*G11C 11/16* (2006.01)
(Continued)

(52) U.S. Cl.
CPC ........ *G11C 11/1675* (2013.01); *G11C 11/161* (2013.01); *G11C 11/1673* (2013.01);
(Continued)

(58) Field of Classification Search
CPC .............. G11C 11/1675; G11C 11/161; G11C 11/1673; G11C 11/412; G11C 14/0081; H03K 3/356; H03K 3/3562
(Continued)

(56) References Cited

U.S. PATENT DOCUMENTS 8,670,264 B1* 3/2014 Abedifard ................ G11C 8/16
365/148
9,099,181 B2* 8/2015 Ong ................... G11C 14/0081
(Continued)

FOREIGN PATENT DOCUMENTS

JP      2004-133969 A    4/2004
JP      2014-112827 A    8/2014
JP      2016-18573 A     2/2016

OTHER PUBLICATIONS

International Search Report prepared by the Japan Patent Office dated May 30, 2016, for International Application No. PCT/JP2016/063536.

*Primary Examiner* — Viet Q Nguyen
(74) *Attorney, Agent, or Firm* — Sheridan Ross P.C.

(57) ABSTRACT

The present technique relates to a non-volatile memory circuit ensuring a small size and low power consumption while maintaining stable write. A slave latch is provided in an NVDFF, and magnetoresistive elements are connected to the slave latch. A store operation for writing information stored in the slave latch to the magnetoresistive elements is performed before power interruption, and a restore operation for reading out information stored in the magnetoresistive elements to the slave latch is performed at a time of return. The store operation and the restore operation use different paths between the slave latch and the magnetoresistive element. The present technique is applicable to a non-volatile memory circuit.

8 Claims, 12 Drawing Sheets

(51) Int. Cl.
  *G11C 11/412* (2006.01)
  *H03K 3/356* (2006.01)
  *G11C 14/00* (2006.01)
  *H03K 3/037* (2006.01)
  *H03K 3/3562* (2006.01)
  *H01L 27/22* (2006.01)
  *H01L 43/08* (2006.01)
  *H01L 43/10* (2006.01)

(52) U.S. Cl.
  CPC ........ *G11C 11/412* (2013.01); *G11C 14/0081* (2013.01); *H03K 3/0372* (2013.01); *H03K 3/356* (2013.01); *H03K 3/3562* (2013.01); *H01L 27/228* (2013.01); *H01L 43/08* (2013.01); *H01L 43/10* (2013.01); *H03K 3/35625* (2013.01)

(58) Field of Classification Search
  USPC ...................................... 365/158, 63, 189.08
  See application file for complete search history.

(56) References Cited

U.S. PATENT DOCUMENTS

| | | | |
|---|---|---|---|
| 9,401,207 B2 * | 7/2016 | Roy | G11C 14/009 |
| 9,548,117 B2 * | 1/2017 | Ma | G11C 13/0069 |
| 9,767,880 B1 * | 9/2017 | Carman | G11C 11/221 |
| 2004/0066669 A1 * | 4/2004 | Ooishi | G11C 14/0081 |
| | | | 365/173 |
| 2010/0141322 A1 * | 6/2010 | Chua-Eoan | G11C 11/005 |
| | | | 327/202 |
| 2010/0315870 A1 * | 12/2010 | Abedifard | G11C 11/16 |
| | | | 365/171 |
| 2012/0020159 A1 * | 1/2012 | Ong | G11C 14/0081 |
| | | | 365/185.08 |
| 2013/0070513 A1 * | 3/2013 | Weiss | G11C 13/0002 |
| | | | 365/148 |
| 2014/0126271 A1 | 5/2014 | Aoki et al. | |
| 2014/0355330 A1 * | 12/2014 | Endoh | H03K 3/356139 |
| | | | 365/148 |
| 2016/0005450 A1 | 1/2016 | Takeno et al. | |
| 2016/0172036 A1 * | 6/2016 | Augustine | G11C 14/0081 |
| | | | 365/66 |
| 2016/0232968 A1 * | 8/2016 | August | G11C 11/161 |

* cited by examiner

NON-VOLATILE MEMORY CIRCUIT

CROSS REFERENCE TO RELATED APPLICATIONS

This application is a national stage application under 35 U.S.C. 371 and claims the benefit of PCT Application No. PCT/JP2016/063536 having an international filing date of 2 May 2016, which designated the United States, which PCT application claimed the benefit of Japanese Patent Application No. 2015-099631 filed 15 May 2015, the disclosures of which are incorporated herein by reference in their entirety.

TECHNICAL FIELD

The present technique relates to a non-volatile memory circuit and particularly relates to a non-volatile memory circuit capable of ensuring a small size and keeping down power consumption while maintaining stable write.

BACKGROUND ART

There has been known a Magnetic Tunnel Junction (MTJ) that is a magnetoresistive element.

As depicted in FIG. 1, the MTJ is an element that includes two layers exhibiting magnetism and a barrier layer provided between the two layers.

Furthermore, as depicted in FIG. 2, a resistance of the MTJ can be changed depending on a voltage applied to the MTJ. Owing to this, it is possible to store information in the MTJ in such a manner, for example, that "1" is stored to correspond to a high resistance state and "0" is stored to correspond to a low resistance state. In FIG. 2, a horizontal axis indicates the voltage and a vertical axis indicates the resistance.

It is assumed herein that the low resistance state of the MTJ is referred to as "Parallel state" (hereinafter, also referred to as "P state") and that the high resistance state thereof is referred to as "Anti-Parallel state" (hereinafter, also referred to as "AP state").

The information stored in the MTJ is retained even if a power is interrupted. Therefore, data in a volatile memory circuit is written to and stored in the MTJ (hereinafter, this operation is also referred to as "store operation") before power gating (PG) interrupts power of the circuit and the power is then interrupted. After power return, the data stored in the MTJ is read out to the volatile memory circuit (hereinafter, this operation is also referred to as "restore operation") and an operation is restarted.

Now, FIG. 3 depicts a circuit configuration of a non-volatile flip-flop (NVFF) using such MTJ elements. This circuit configuration is an example in which a pMOS (positive Metal Oxide Semiconductor) transistor is employed as a power switch (PS) that is used for power interruption at a time of implementing the PG.

A power supply line of the NVFF circuit is connected to a virtual power supply line (VDDV) and coupled to a true power supply line VDD via the PS configured with the pMOS transistor. With this configuration, when the PS is turned off, power of the NVFF circuit is interrupted. A control signal RB is an asynchronous reset signal, so that data stored in the NVFF can be initialized to "0" by setting the control signal RB to "0."

The NVFF circuit sets a control signal SR to "1," turns on an nMOS connected to the control signal SR, and applies voltages corresponding to both "1" and "0" to a control signal CTRL, thereby writing retained 1-bit information to the MTJs. Furthermore, the NVFF circuit turns on the control signal SR and the PS after the PG, whereby a circuit state of the NVFF circuit returns to a state of having written data by using a resistance difference between the MTJs. This restore operation uses the following phenomenon.

In a case of the power gating using the pMOS transistor as the PS, voltages of nodes within the circuit decrease to be close to 0 V by leakage with passage of time after the PG. When the NVFF circuit turns on the control signal SR and the PS and sets the CTRL to 0 V at a time of the power return, a restore current is carried from a slave latch to which a power supply voltage is supplied to the CTRL line through magnetoresistive elements MTJ1 and MTJ2.

If the magnetoresistive element MTJ1 is in a high resistance state and the magnetoresistive element MTJ2 is in a low resistance state, a voltage of a node N3 increases to be higher than a voltage of a node N4 when the restore current is carried. Owing to this, a conductance reduction due to an increase of a source voltage occurs in an nMOS transistor TR1 more conspicuously than in an nMOS transistor TR2.

The current carried through the nMOS transistor TR1 thereby becomes lower than that carried through the nMOS transistor TR2 and a current difference between the transistors TR1 and TR2 is equal to or greater than the resistance difference between the magnetoresistive elements MTJ1 and MTJ2. As a result, a voltage of a node N1 increases to be higher than a voltage of a node N2, a positive feedback is applied in a loop configured with an INV1 and a NAND (Not AND) within the slave latch, and the voltage of the node N1 returns to a power supply voltage, that is, the value "1" and the voltage of the node N2 returns to 0 V, that is, the value "0."

In this way, the existing circuit generates the current difference equal to or greater than the resistance difference between the magnetoresistive elements MTJ1 and MTJ2 by using the conductance reduction due to the increase of the source voltage during the restore operation by using the nMOS transistor for each of the TR1 and TR2 in implementing the power gating using the pMOS transistor as the PS, thereby realizing the stable restore operation.

As described above, the flip-flop depicted in FIG. 3 can continue to retain the data (exhibit non-volatility) even with the power interruption.

Furthermore, when a circuit including the NVDFF (Non-volatile D Flip-Flop) is in a standby state, implementing the PG can greatly suppress unnecessary energy from being consumed during standby. Moreover, it is possible to retain the circuit state before and after the implementation of the PG.

SUMMARY

Technical Problem

However, in the NVDFF circuit depicted in FIG. 3, it is necessary to carry a current through the MTJs in a store operation for storing the information retained in the slave latch of the NVDFF in the MTJs.

A case in which the information stored in the magnetoresistive element MTJ1 is "0," that is, the magnetoresistive element MTJ1 is in the P state and a value of "1" of the slave latch (that is, the value of "1" of the node N1) is stored in the magnetoresistive element MTJ1 will now be described.

When the value of the slave latch is "1," the voltage of the node N1 within the DFF is identical to the power supply voltage, that is, a high voltage. Owing to this, the control signal SR is set to "1" and the CTRL is set to "0," that is, 0 volts.

A store current is thereby carried from the inverter INV1 within the slave latch to the CTRL line through a transmission gate 1, the nMOS (negative MOS) transistor TR1, and the magnetoresistive element MTJ1. As a result, magnetization reversal occurs to the magnetoresistive element MTJ1 to change the state of the magnetoresistive element MTJ1 from the P state to the AP state, and data of "1" is stored in the magnetoresistive element MTJ1.

Here, a minimum value of a current necessary for the magnetization reversal is referred to as "magnetization reversal critical current $I_c$." Generally, in the MTJ, an $I_{C\_P \to AP}$ at a time of the magnetization reversal from the P state to the AP state is higher than an $I_{C\_AP \to P}$ at a time of the magnetization reversal from the AP state to the P state.

In the store operation described above, the store current is carried from the nMOS transistor TR1 to the magnetoresistive element MTJ1, so that the node N3 serves as a source of the nMOS transistor. However, while the store current is being carried, the voltage of the node N3 increases by a resistance component of the magnetoresistive element MTJ1.

The increase of the source voltage causes the conductance reduction of the nMOS transistor TR1. Owing to this, it is necessary to increase a size of the nMOS transistor TR1 in order to carry the store current equal to or higher than the $I_{C\_P \to AP}$, resulting in an area increase.

On the other hand, when the size of the nMOS transistor TR1 is increased and the nMOS transistor TR1 is turned on, the voltage of the node N1 is greatly reduced.

If the reduction is excessively large, then the node N1 cannot maintain a high voltage and the data of "1" retained in the slave latch is inverted, with the result that normal write of "1" to the magnetoresistive element MTJ1 cannot be performed. This phenomenon is referred to as a "latch failure during store operation."

To prevent the latch failure, it is necessary to increase sizes of the INV1 and the TG1, which causes an area increase of the slave latch. Moreover, likelihood of the latch failure largely depends on manufacturing unevenness for transistors and MTJs. Owing to this, there is no avoiding increasing the sizes of transistors that constitute the slave latch to suppress the latch failure in a state of presence of the unevenness. This further increases the area.

On the contrary to the aforementioned, if the data of "1" is originally stored in the magnetoresistive element MTJ1 and the value "0" of the slave latch is stored in the magnetoresistive element MTJ1, then the voltage of the CTRL is set to the high voltage (power supply voltage) and the data is written to the MTJ.

At this time, the store current is carried from the CTRL line through the magnetoresistive element MTJ1, the TR1, the TG1, and an nMOS within the INV1 to a ground. As for a direction of this current, the conductance reduction described above does not occur even when the voltage of the node N3 falls since the node N3 serves as the drain of the nMOS transistor TR1.

This store current causes the magnetization reversal of the magnetoresistive element MTJ1 from the AP state to the P state to store the data of "0" in the magnetoresistive element MTJ1. At this time, the magnetization reversal critical current $I_{C\_AP \to P}$ is lower than the $I_{C\_P \to AP}$ and the conductance reduction does not occur in the TR1. Owing to this, the store current when the data of "0" is stored in the magnetoresistive element MTJ1 is far lower than that when the data of "1" is stored therein.

Nevertheless, there is no avoiding setting the size of the TR1 to be large enough to carry the current $I_{C\_P \to AP}$ so that the data of "1" can be stored in the magnetoresistive element MTJ1. As a result, an excessively high store current is carried at a time of storing the data of "0." This leads to the unnecessary power consumption during the store operation.

The present technique has been made in the light of these circumstances and an object of the present technique is to make it possible to obtain a non-volatile memory circuit ensuring a small size and low power consumption while maintaining stable write.

Solution to Problem

A non-volatile memory circuit according to one aspect of the present technique includes: a volatile memory unit configured to store information; and a non-volatile memory unit to which the information stored in the volatile memory unit is written by a store operation, and from which the information is read out to the volatile memory unit by a restore operation, wherein a path during the store operation for the information differs from a path during the restore operation for the information between the volatile memory unit and the non-volatile memory unit.

A first memory node and a second memory node can be provided in the volatile storage unit, a first memory element and a second memory element can be provided in the non-volatile memory unit, during the store operation, information retained in the first memory node can be written to the second memory element via a first inverting element, and information retained in the second memory node can be written to the first memory element via a second inverting element, and during the restore operation, information retained in the first memory element can be read out to the first memory node, and information retained in the second memory element can be read out to the second memory node.

The first memory element and the second memory element can be configured with magnetoresistive elements.

The first memory node and the second memory element can be connected to each other via the first inverting element and a first transistor, and the second memory node and the first memory element can be connected to each other via the second inverting element and a second transistor.

The first memory node and the first memory element can be connected to each other via a third transistor, and the second memory node and the second memory element can be connected to each other via a fourth transistor.

During the store operation, the first transistor and the second transistor can be turned on and the third transistor and the fourth transistor can be turned off.

During the restore operation, the first transistor and the second transistor can be turned off and the third transistor and the fourth transistor can be turned on.

The first transistor and the second transistor can be configured with positive metal oxide semiconductor transistors, and the third transistor and the fourth transistor can be configured with negative metal oxide semiconductor transistors.

The first transistor and the second transistor can be configured with negative metal oxide semiconductor transistors, and the third transistor and the fourth transistor can be configured with positive metal oxide semiconductor transistors.

According to one aspect of the present technique, a non-volatile memory circuit includes: a volatile memory unit configured to store information; and a non-volatile memory unit to which the information stored in the volatile memory unit is written by a store operation, and from which the information is read out to the volatile memory unit by a restore operation, wherein a path during the store operation for the information differs from a path during the restore operation for the information between the volatile memory unit and the non-volatile memory unit.

Advantageous Effect of Invention

According to one aspect of the present technique, it is possible to obtain a non-volatile memory circuit ensuring a small size and low power consumption while maintaining stable write.

It is noted that the effect of the present technique is not always limited to those described in this section and may be any effects described in the present disclosure.

DESCRIPTION OF EMBODIMENTS

Embodiments to which the present technique is applied will be described hereinafter with reference to the drawings.

First Embodiment

<Example of Configuration of NVDFF>

Figure 1:
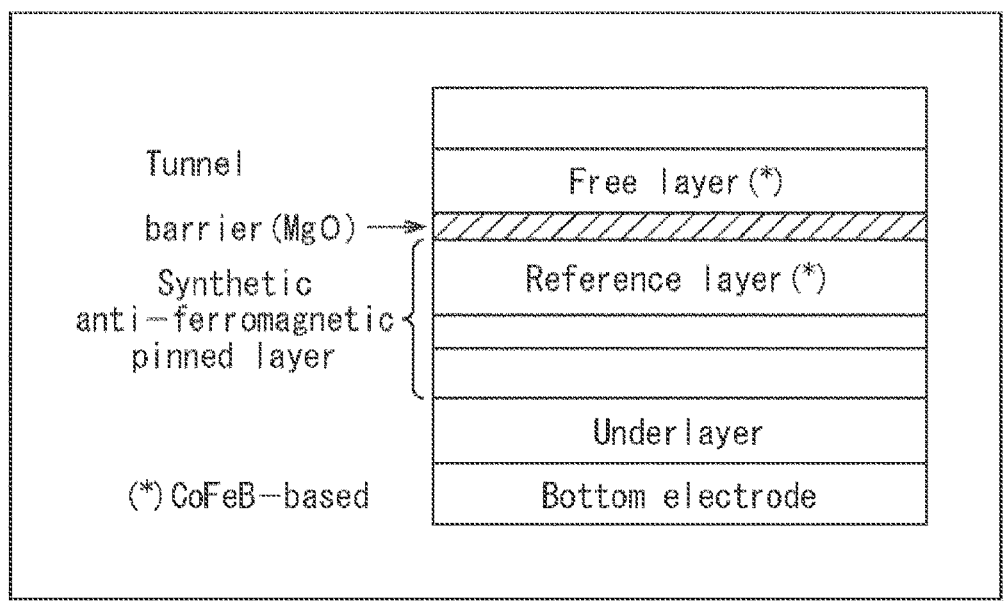
FIG. 1 depicts a configuration of a magnetoresistive element.
Figure 2:
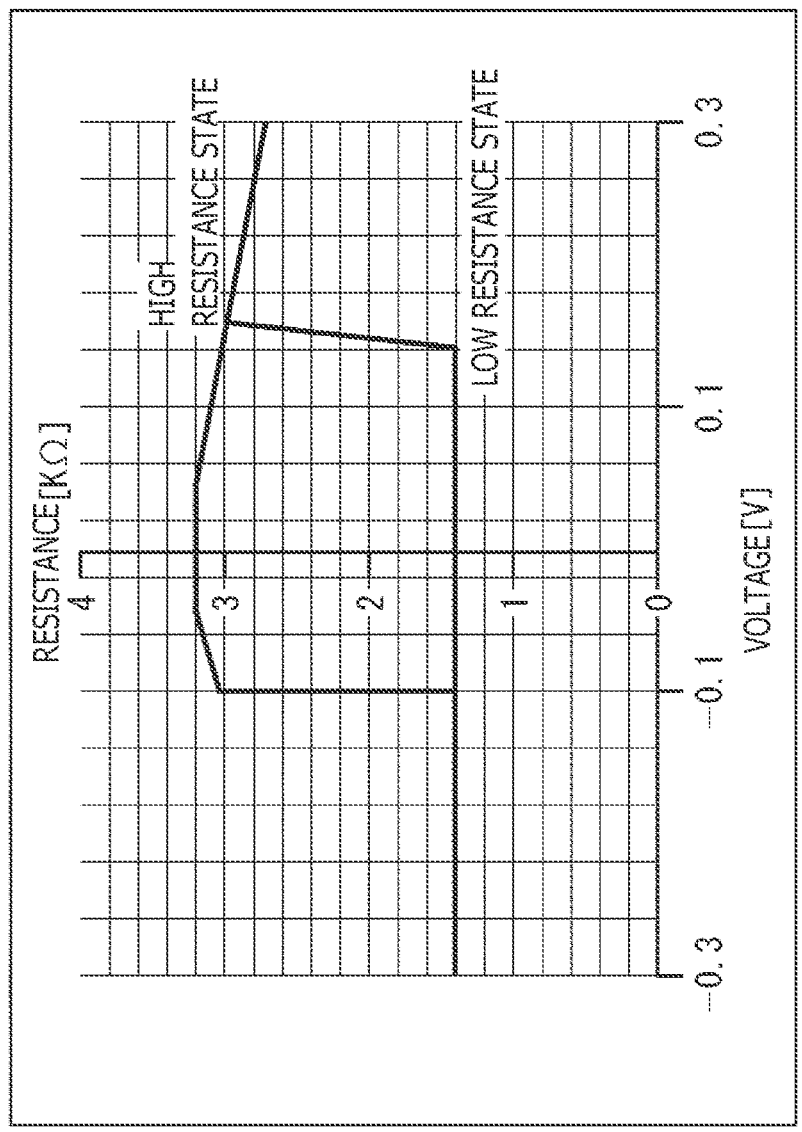
FIG. 2 is an explanatory diagram of a change of a resistance of the magnetoresistive element.
Figure 3:
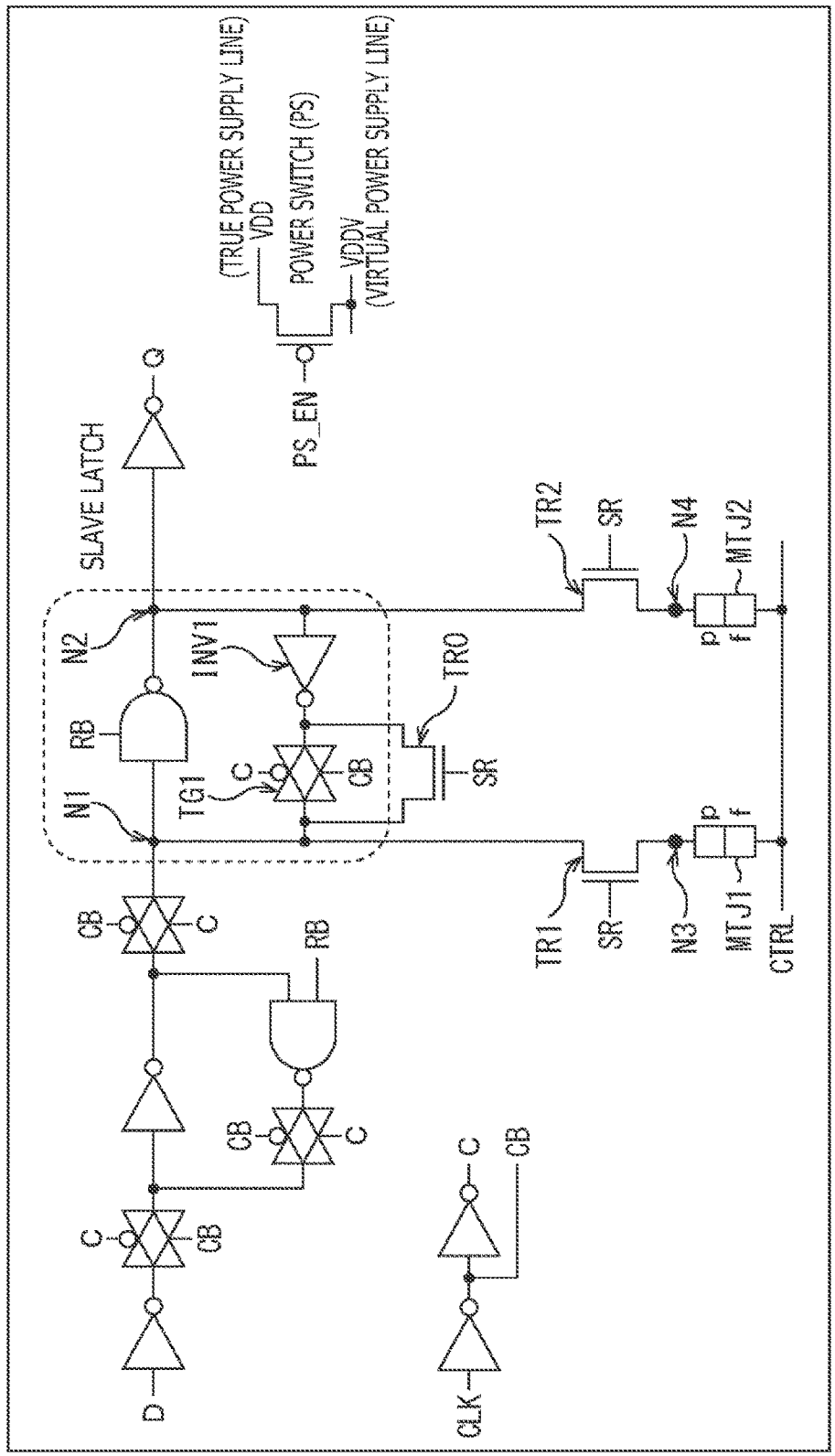
FIG. 3 depicts an example of a configuration of an existing NVFF.

The present technique relates to a technique for configuring a non-volatile memory circuit by using MTJs that are magnetoresistive elements depicted in FIG. 1 in a volatile memory circuit such as a D flip-flop or an SRAM (Static Random Access Memory).

There is known a power gating technique for interrupting power within a chip as a low power consumption technique for a semiconductor integrated circuit (LSI (Large-Scale Integration)). If the power is interrupted, then a memory circuit such as a flip-flop (F/F) or an on-chip memory cannot retain stored data and an internal state and internal data are erased. There is proposed a memory circuit to which magnetoresistive elements (MTJs) are added as means for resolution. However, with an existing circuit, there is no avoiding increasing transistor sizes of a memory circuit body to ensure stable write of data to the MTJs, resulting in an increase of an area and an increase of power consumption. Furthermore, there is a need of a circuit that can suppress the area and the power while maintaining the stable write of data to the MTJs.

To address the need, the present technique has been able to provide an NVDFF circuit capable of solving a dilemma of "ensuring a magnetization reversal critical current" and a "latch failure" during a store operation, and reducing power consumption by realizing the store operation with a lower store current.

Figure 4:
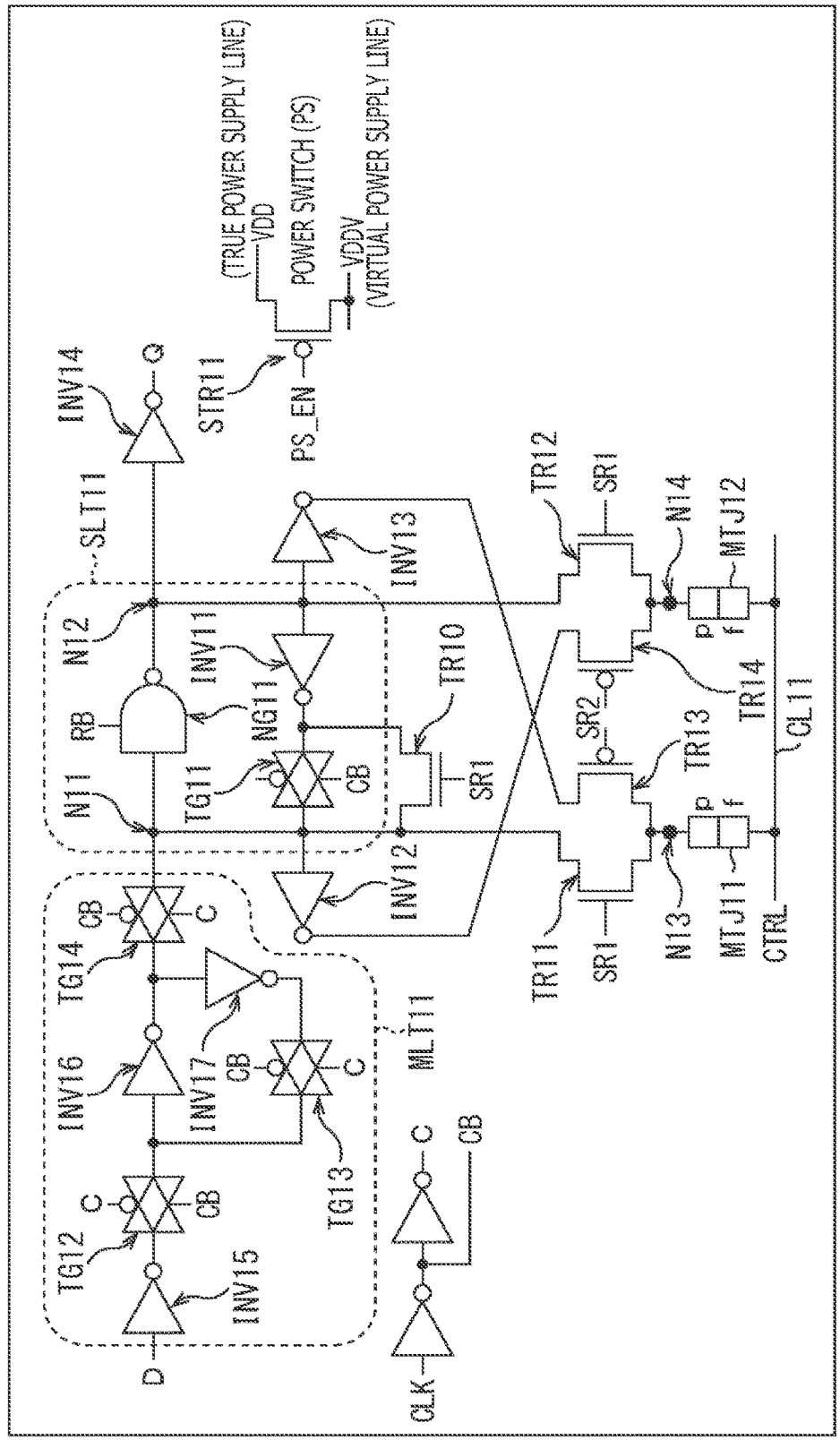
FIG. 4 depicts an example of a configuration of an NVDFF to which the present technique is applied.

FIG. 4 depicts a circuit configuration to which the present technique is applied. The present technique is mainly characterized by three features.

A first feature of the present technique is a structure in which, during store operation, a value of a memory node N11 of a slave latch SLT 11 is written to a magnetoresistive element MTJ 12 via an inverter INV12 and a transistor TR14 (and a value of a memory node N12 is similarly written to a magnetoresistive element MTJ 11 via an inverter INV13 and a transistor TR13).

A second feature of the present technique is that paths connecting the slave latch SLT 11 to the magnetoresistive elements (MTJ) during a store operation are separated from those during a restore operation. In other words, during the store operation, the paths from the memory nodes of the slave latch SLT 11 to the MTJs via the inverters (INV12 and INV13) and pMOS transistors (TR13 and TR14) are formed as described above.

On the other hand, during the restore operation, paths from the MTJs to the memory nodes of the slave latch SLT 11 via nMOS transistors (TR11 and TR12) are formed.

A third feature of the present technique is a structure in which for implementing power gating using a pMOS transistor STR 11 as a PS, the pMOS transistors are used as the transistors TR13 and TR14 that are used in the paths during the store operation, while the nMOS transistors are used as the transistors TR11 and TR12 that are used in the paths during the restore operation.

According to the present technique, a memory circuit has a structure such that during the store operation, an output from the memory node of the slave latch SLT 11 is received first by a gate (the inverter) and connected to the transistor TR13 (or transistor TR14). Owing to this, even if a size of the transistor TR13 (or transistor TR14) is set large to secure a store current equal to or higher than $I_{C\_P \to AP}$, this setting does not at all has an influence on a voltage of the memory node of the slave latch SLT11. In other words, the memory circuit is advantageously, structurally immune to the latch failure during the store operation.

Another advantage is as follows. Since the physically different paths are used between the store operation and the restore operation, it is possible to select a combination of different types of transistors, for example, a combination of the transistor TR11 that is the nMOS transistor and the transistor TR13 that is the pMOS transistor as depicted in FIG. 4.

If the pMOS transistor is used as the transistor TR13 that is used in the path during the store operation, a node N13 acts as a drain of the pMOS transistor when data of "1" is written to the magnetoresistive element MTJ11 by carrying a store current to the magnetoresistive element MTJ11 through the inverter INV13 and the transistor TR13. Owing to this, even when a voltage of the node N13 increases, a conductance reduction due to an increase of a source potential does not occur to the transistor TR13. It is unnecessary to increase sizes of the transistor TR13 and the inverter INV13, so that it is possible to keep down an area and suppress power consumption during the store operation.

In this way, according to the present technique, it is possible to realize the non-volatile memory circuit capable of solving the dilemma of "ensuring the magnetization reversal critical current" and the "latch failure" during the store operation, and yet capable of reducing the power consumption by realizing the store operation with a lower store current and, at the same time, keeping down the area.

FIG. 4 depicts an example of a configuration of a first embodiment to which the present technique is applied.

The circuit configuration depicted in FIG. 4 is an example in which the pMOS transistor STR11 is used as the PS at a time of implementing the PG. The circuit depicted in FIG. 4 is connected to a virtual power supply line (VDDV) instead of a power supply line, and is connected to a true power supply line (VDD) through the pMOS transistor STR11 that is the PS. With this configuration, when the PS is turned off, the circuit is electrically disconnected from the true power supply line to realize the PG. In this way, the example of using the pMOS transistor as the switch for the PG is effective for a process in a case, for example, in which a gate length size is equal to or smaller than 40 nm. This is because the pMOS transistor is lower in a leak current of a gate than an nMOS transistor even if the pMOS transistor is downscaled.

With the circuit configuration depicted in FIG. 4, a non-volatile memory unit configured with the magnetoresistive elements MTJ11 and MTJ12 is connected, via the transistors, to the memory nodes of a D flip-flop circuit that serves as a volatile memory unit that includes a master latch MLT11 and the slave latch SLT11.

The master latch MLT 11 includes inverters INV15 to INV17 and transmission gates TG12 to TG14. The transmission gate TG12 is turned on at timing at which a clock signal CLK falls, and turned off at timing at which the clock signal CLK rises. Moreover, the transmission gates TG13 and TG14 are turned off at the timing at which the clock signal CLK falls, and turned on at the timing at which the clock signal CLK rises.

An input side of the inverter INV15 serves as an input terminal of the master latch MLT11, and an output side of the inverter INV15 is connected to an input side of the inverter INV16 via the transmission gate TG12. Furthermore, the memory node N11 of the slave latch SLT11 is connected to an output side of the inverter INV16 via the transmission gate TG14 and also to an input side of the inverter INV17. Moreover, an output side of the inverter INV17 is connected to the input side of the inverter INV16 via the transmission gate TG13. In other words, an output side of the transmission gate TG13 is connected between the inverter INV16 and the transmission gate TG12.

Stored data input to the master latch MLT11 is inverted by the inverter INV15, input to the inverter INV16 via the transmission gate TG12, further inverted by a loop configured with the inverters INV16 and INV17 back to original logic, and then supplied to the memory node N11 via the transmission gate TG14.

The slave latch SLT11 includes the memory node N11, a NAND gate NG11, the memory node N12, an inverter INV11, and a transmission gate TG11.

The NAND gate NG11 is provided between the memory nodes N11 and N12, and a control signal RB is supplied to the NAND gate NG11.

Input terminals of an inverter INV14, the inverter INV11, and the inverter INV13 are connected to the memory node N12. An output side of the inverter INV11 is connected to the memory node N11 via the transmission gate TG11. The clock signal CLK is supplied to the transmission gate TG11, and the transmission gate TG11 is turned on at the timing at which the clock signal CLK falls and turned off at the timing at which the clock signal CLK rises.

Moreover, a transistor TR10 that is an nMOS transistor is connected to both ends of the transmission gate TG11. In other words, one end of the transistor TR10 is connected to an input side of the transmission gate TG11 while the other end of the transistor TR10 is connected to an output side of the transmission gate TG11. A control signal SR1 is supplied to a gate of the transistor TR10.

A pinned layer (p) of the magnetoresistive element MTJ12 that is a memory element is connected to the memory node N11 via the inverter INV12 that is an inverting element and the transistor TR14. Here, a node between the transistor TR14 and the pinned layer of the magnetoresistive element MTJ12 is a node N14.

Furthermore, a pinned layer (p) of the magnetoresistive element MTJ11 is connected to the memory node N11 via the transistor TR11. Here, a node between the transistor TR11 and the pinned layer of the magnetoresistive element MTJ11 is the node N13.

The pinned layer of the magnetoresistive element MTJ11 that is a memory element is connected to the memory node N12 via the inverter INV13 that is an inverting element and the transistor TR13, and the node between the transistor TR13 and the pinned layer of the magnetoresistive element MTJ11 is the node N13.

Furthermore, the pinned layer of the magnetoresistive element MTJ12 is connected to the memory node N12 via the transistor TR12, and the node between the transistor TR12 and the pinned layer of the magnetoresistive element MTJ12 is the node N14.

Here, the transistors TR11 and TR12 are the nMOS transistors and the control signal SR1 is supplied to gates of the transistors. Furthermore, the transistors TR13 and TR14 are the pMOS transistors and a control signal SR2 is supplied to gates of the transistors.

Moreover, a control line CL11 that is a CTRL line is connected to a free layer (f) of the magnetoresistive element MTJ11 and a free layer (f) of the magnetoresistive element MTJ12.

Circuit operations performed by the NVDFF depicted in FIG. 4 will be described below. The present NVDFF has four operation modes (active, store, sleep, and restore).

First, in the active mode, the NVDFF turns on the pMOS transistor STR11 that is the PS, turns off all the transistors TR10, TR11, and TR12 that are the nMOS transistors and the transistors TR13 and TR14 that are the pMOS transistors, and performs a normal flip-flop operation controlled by the clock signal CLK.

At this time, the NVDFF is initialized in such a manner that the control signal RB supplied first to the NAND gate 11 is set to "0," a value of the memory node N12 becomes "1," and a value of the memory node N11 becomes "0." Subsequently, the control signal RB continues to be set to "1." Further, as described above, in the flip-flop operation, the stored data input to the master latch MLT11 is stored in the memory node N11 and data obtained by inverting the stored data in the memory node N11 is stored in the memory node N12.

Next, in the store mode, the NVDFF stops toggling the clock signal CLK and both the control signals SR1 and SR2 are set to "0."

By doing so, the transistors TR10, TR11, and TR12 are turned off, and the transistors TR13 and TR14 are turned on.

If a value of the CTRL that is the control line CL11 is set to "0" in this state, that is, when a voltage applied to the control line CL11 is set to 0 V, and if the value of the memory node N11 within the slave latch SLT11 is "1," that is, the voltage of the memory node N11 is a power supply voltage, then the value of the memory node N12 becomes "0," that is, the voltage of the memory node N12 becomes "0," and an output from the inverter INV13 becomes "1."

At this time, a current is carried from (a pMOS transistor within) the inverter INV13 to the CTRL line (control line CL11) through the transistor TR13 and the magnetoresistive element MTJ11.

Since electrons flow from the free layer (f) to the pinned layer (p) within the magnetoresistive element MTJ11, the magnetoresistive element MTJ11 turns into the AP state. In other words, the information, that is, the stored data retained in the memory node N12 is written to the magnetoresistive element MTJ11 in a state in which the stored data is inverted via the inverter INV13.

On the other hand, the value of the memory node N11 is "1" and an output from the inverter INV12 is, therefore, "0," so that, in a state in which the CTRL is "0," no current is carried through the transistor TR14 and the magnetoresistive element MTJ12 and magnetization reversal does not occur in the magnetoresistive element MTJ12.

Next, when the value of the CTR that is the control line CL11 is set to "1," then no current is carried through the magnetoresistive element MTJ11, and a current is carried from the CTRL line, that is, the control line CL11, to (an nMOS transistor within) the inverter INV12 through the magnetoresistive element MTJ12 and the transistor TR14.

At this time, since electrons flow from the pinned layer (p) to the free layer (f) within the magnetoresistive element MTJ12, the magnetoresistive element MTJ12 turns into the P state. In other words, the information, that is, stored data retained in the memory node N11 is written to the magnetoresistive element MTJ12 in a state in which the stored data is inverted via the inverter INV12.

After the store operation described above, the NVDFF transitions into the sleep mode. In the example depicted in FIG. 4, the free layer (f) is provided on a CTRL line-side, that is, on a control line CL11-side in each of the magnetoresistive elements MTJ11 and MTJ12.

In the sleep mode, the pMOS transistor STR11 that is the PS is turned off. The power of the circuit is thereby interrupted to cut a leak current carried through the circuit.

At a time of return from a sleep state, the NVDFF operates in the restore mode.

In the restore mode, the control signals SR1 and SR2 are set to "1," the transistors TR11, TR12, and TR10 are turned on, and the transistors TR13 and TR14 are turned off. Further, the CTRL that is the control line CL11 is set to "0." In this state, the PS is turned on.

In the sleep state, voltages of the nodes within the circuit decrease to be close to 0 V by leakage. However, when the PS is turned on, a restore current is carried from the slave latch SLT 11 to which the power supply voltage is supplied to the CTRL line (control line CL11) through the magnetoresistive elements MTJ11 and MTJ12.

A magnetization state of the magnetoresistive element MTJ11 is set to the AP state (high resistance state) and that of the magnetoresistive element MTJ12 is set to the P state (low resistance state) are set as described above in the store mode. In this case, when the restore current is carried, the voltage of the node N13 increases to be higher than a voltage of the node N14 due to a difference in an electrical resistance between the magnetoresistive elements MTJ11 and MTJ12.

Owing to this, the conductance reduction due to the increase of the source voltage occurs in the nMOS transistor TR11 more conspicuously than in the transistor TR12.

The current carried through the transistor TR11 thereby becomes lower than that carried through the transistor TR12 and a current difference between the transistors TR11 and TR12 is equal to or greater than the resistance difference between the magnetoresistive elements MTJ11 and MTJ12. As a result, the voltage of the memory node N11 increases to be higher than the voltage of the memory node N12, a positive feedback is applied in a loop configured with the inverter INV11 and the NAND gate NG11 within the slave latch SLT11, and the voltage of the memory node N11 returns to the power supply voltage, that is, the value of "1" and the voltage of the memory node N12 returns to 0 V, that is, the value of "0." In other words, the restore operation causes the information retained (stored) in the magnetoresistive element MTJ11 to be read out to the memory node N11 as the stored data, and the information retained (stored) in the magnetoresistive element MTJ12 to be read out to the memory node N12.

Second Embodiment

<Example of Configuration of NVDFF>

Figure 5:
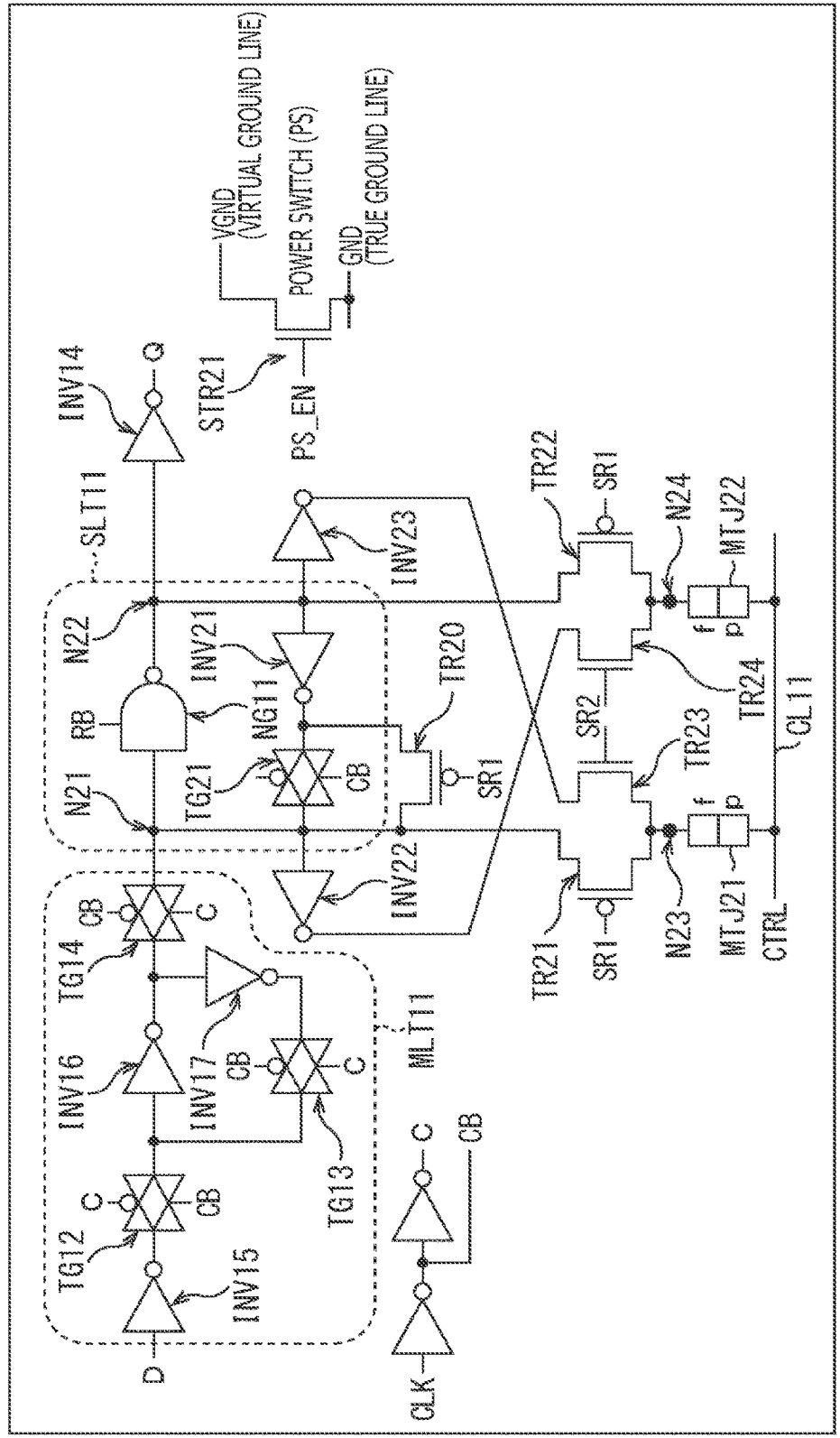
FIG. 5 depicts an example of a configuration of an NVDFF.

FIG. 5 depicts an example of a configuration of a second embodiment to which the present technique is applied. In FIG. 5, corresponding parts to those in FIG. 4 are denoted by the same reference symbols and description thereof is omitted as appropriate.

The circuit configuration depicted in FIG. 5 is an example in which an nMOS transistor STR21 is used as the PS at the time of implementing the PG. In this way, the example of using the nMOS transistor as the switch for the PG is effective for a process in a case, for example, in which the gate length is up to approximately 65 nm.

The circuit depicted in FIG. 5 is connected to a virtual ground line (VGND) instead of a ground line, and is connected to a true ground line (GND) through the nMOS transistor STR21 that is the PS. With this configuration, when the PS is turned off, the circuit is electrically disconnected from the true ground line to realize the PG.

A feature of the circuit depicted in FIG. 5, unlike the example depicted in FIG. 4, is that nMOS transistors are used as transistors TR23 and TR24 that are used during the store operation, and pMOS transistors are used as transistors TR21, TR22, and TR20 that are used during the restore operation. Furthermore, orientations of a pinned layer (p) and a free layer (f) of each of magnetoresistive elements MTJ21 and MTJ22 are opposite to those in the example of FIG. 4.

Therefore, the configuration of a circuit depicted in FIG. 5 is different from the configuration depicted in FIG. 4 in that the nMOS transistor STR21, the transistors TR20 to TR24, and the magnetoresistive elements MTJ21 and MTJ22 are provided as an alternative to the pMOS transistor STR11, the transistors TR10 to TR14, and the magnetoresistive elements MTJ11 and MTJ12, and is the same as that depicted in FIG. 4 in other respects.

In FIG. 5, memory nodes N21 and N22 correspond to the memory nodes N11 and N12 in FIG. 4, and inverters INV21 to INV23 and a transmission gate TG21 correspond to the inverters INV11 to INV13 and the transmission gate TG11 depicted in FIG. 4.

In the example depicted in FIG. 5, the free layer (f) of the magnetoresistive element MTJ22 is connected to the memory node N21 via the inverter INV22 and the transistor TR24. Here, a node between the transistor TR24 and the free layer of the magnetoresistive element MTJ22 is a node N24.

Furthermore, the free layer (f) of the magnetoresistive element MTJ21 is connected to the memory node N21 via the transistor TR21. Here, a node between the transistor TR21 and the free layer of the magnetoresistive element MTJ21 is a node N23.

The free layer of the magnetoresistive element MTJ21 is connected to the memory node N22 via the inverter INV23 and the transistor TR23, and a node between the transistor TR23 and the free layer of the magnetoresistive element MTJ21 is the node N23.

Moreover, the free layer of the magnetoresistive element MTJ22 is connected to the memory node N22 via the transistor TR22, and a node between the transistor TR22 and the free layer of the magnetoresistive element MTJ22 is the node N24.

Here, the transistors TR20, TR21, and TR22 are the pMOS transistors and the control signal SR1 is supplied to gates of the transistors. Further, the transistors TR23 and TR24 are the nMOS transistors and the control signal SR2 is supplied to gates of the transistors.

Moreover, the control line CL11 that is the CTRL line is connected to the pinned layer (p) of the magnetoresistive element MTJ21 and the pinned layer (p) of the magnetoresistive element MTJ22.

Circuit operations performed by an NVDFF depicted in FIG. 5 include four operation modes (active, store, sleep, and restore) similarly to the circuit depicted in FIG. 4.

In the active mode, the NVDFF operates similarly to the example depicted in FIG. 4. While the NVDFF then performs the store operation in the store mode, differences from the circuit depicted in FIG. 4 in the store mode will be described herein.

In the circuit depicted in FIG. 5, both the control signals SR1 and SR2 are set to "1" in the store mode. By doing so, the transistors TR20, TR21, and TR22 are turned off, and the transistors TR23 and TR24 are turned on.

When the value of the CTR that is the CL11 is set to "1" in this state and if a value of the memory node N21 within the slave latch SLT11 is "1," an output from the inverter INV22 becomes "0." Owing to this, a current is carried from the CTRL line, that is, the control line CL11 to (an nMOS transistor within) the inverter INV22 through the magnetoresistive element MTJ22 and the transistor TR24. The magnetoresistive element MTJ22 thereby turns into the AP state. In other words, information, that is, stored data retained in the memory node N21 is written to the magnetoresistive element MTJ22 as it is via the inverter INV22.

Next, if the value of the CTRL is set to "0," a value of the memory node 22 is "0" and an output from the inverter INV23 is, therefore, "1." Owing to this, a current is carried from (a pMOS transistor within) the inverter INV23 to the CTRL line, that is, the control line CL11 through the transistor TR23 and the magnetoresistive element MTJ21. The magnetoresistive element MTJ21 thereby turns into the P state. In other words, information, that is, stored data retained in the memory node N22 is written to the magnetoresistive element MTJ21 as it is via the inverter INV23.

In this way, when the value of the memory node N21 is "1," the stored data is stored in the magnetoresistive element MTJ21 that is in the P state and stored in the magnetoresistive element MTJ22 that is in the AP state by the store operation.

On the other hand, in the circuit depicted in FIG. 4, when the value of the memory node N11 is "1," the stored data is stored in the magnetoresistive element MTJ11 that is in the AP state and stored in the magnetoresistive element MTJ12 that is in the P state by the store operation, which is exactly opposite to the circuit depicted in FIG. 5.

In the restore mode, the control signals SR1 and SR2 are set to "0," the transistors TR21, TR22, and TR20 are turned on, and the transistors TR23 and TR24 are turned off. Further, the CTRL that is the control line CL11 is set to "1."

In this state, the PS is turned on. In the sleep state, a current path to the ground is interrupted, so that voltages of the nodes within the circuit increase to be close to the power supply voltage by leakage. However, when the PS is turned on, a ground voltage is supplied to the slave latch SLT11. The restore current is thereby carried from the CTRL line, that is, the control line CL11 to the slave latch SLT11 through the magnetoresistive elements MTJ21 and MTJ22.

A magnetization state of the magnetoresistive element MTJ21 is set to the P state (low resistance state) and that of the magnetoresistive element MTJ22 is set to the AP state (high resistance state) in the store mode. In this case, when the restore current is carried, a voltage of the node N24 decreases to be lower than a voltage of the node N23 due to a difference in an electrical resistance between the magnetoresistive elements MTJ21 and MTJ22.

Owing to this, the conductance reduction due to a reduction of the source voltage occurs in the pMOS transistor TR22 more conspicuously than in the transistor TR21. The current carried through the transistor TR22 thereby becomes lower than that carried through the transistor TR21 and a current difference between the transistors TR22 and TR21 is equal to or greater than the resistance difference between the magnetoresistive elements MTJ21 and MTJ22. As a result, a voltage of the memory node N22 decreases to be lower than a voltage of the memory node N21, a positive feedback is applied in a loop configured with the inverter INV21 and the NAND gate NG11 within the slave latch SLT11, and the voltage of the node N21 returns to the power supply voltage, that is, the value of "1" and the voltage of the node N22 returns to 0 V, that is, the value of "0." In other words, the restore operation causes the information retained (stored) in the magnetoresistive element MTJ21 to be inverted and read out to the memory node N21 as the stored data, and the information retained (stored) in the magnetoresistive element MTJ22 to be inverted and read out to the memory node N22 as the stored data.

Third Embodiment

<Example of Configuration of NVDFF>

Figure 6:
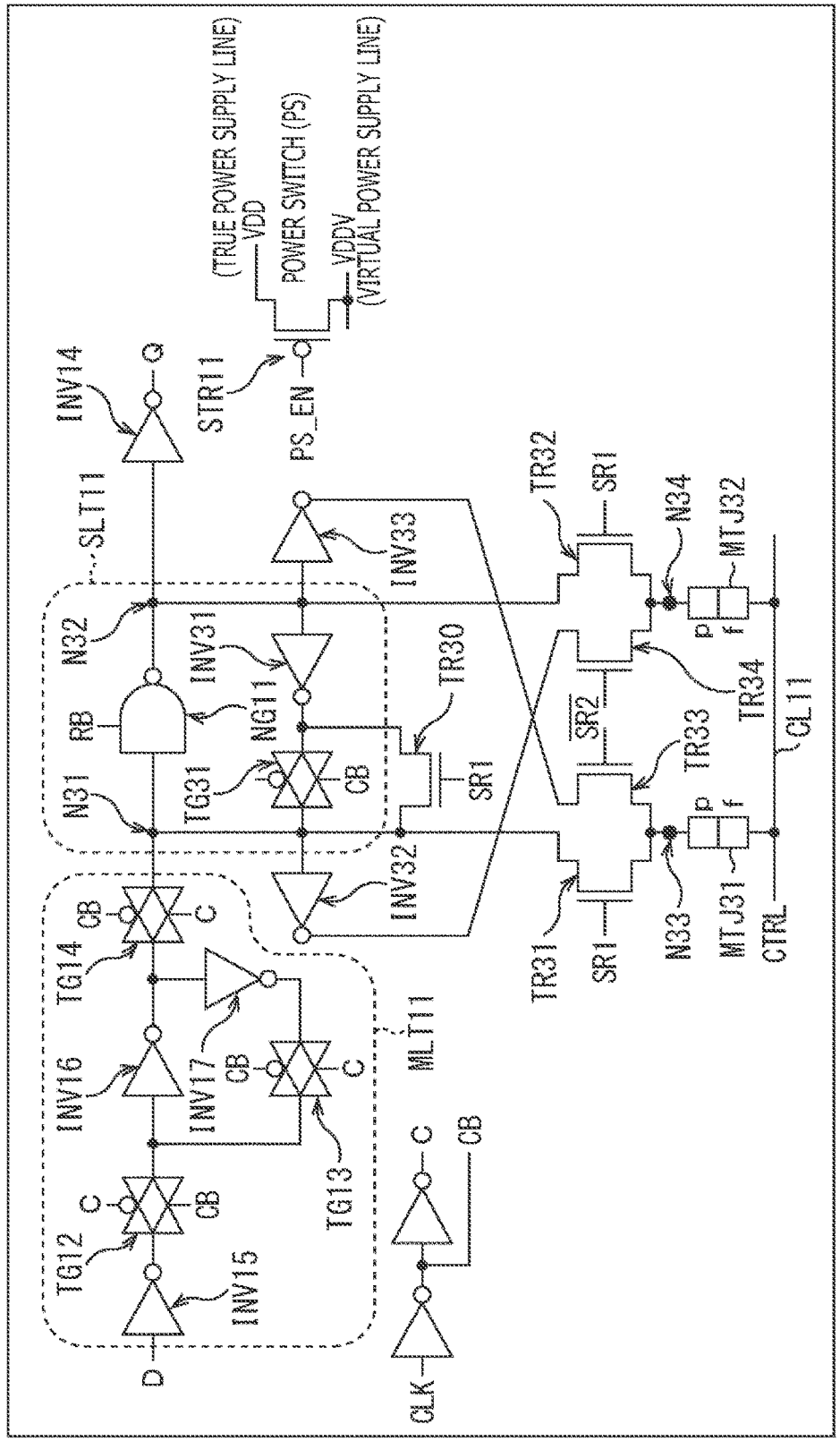
FIG. 6 depicts an example of a configuration of an NVDFF.

FIG. 6 depicts an example of a configuration of a third embodiment to which the present technique is applied. In FIG. 6, corresponding parts to those in FIG. 4 are denoted by the same reference symbols and description thereof is omitted as appropriate.

A circuit configuration depicted in FIG. 6 is an example in which the pMOS transistor STR11 is used as the PS at a time of implementing the PG similarly to the example depicted in FIG. 4. The third embodiment differs from the first embodiment depicted in FIG. 4 only in that transistors TR33 and TR34 used during the store operation are each configured with an nMOS transistor.

In other words, the configuration of a circuit depicted in FIG. 6 is different from the configuration depicted in FIG. 4 in that the transistors TR33 and TR34 that are the nMOS transistors are provided as an alternative to the transistors TR13 and TR14, and is the same as that depicted in FIG. 4 in other respects. A signal obtained by inverting the control signal SR2 is supplied to gates of the transistors TR33 and TR34.

Furthermore, in FIG. 6, memory nodes N31 and N32 correspond to the memory nodes N11 and N12 in FIG. 4, and inverters INV31 to INV33 and a transmission gate TG31 correspond to the inverters INV11 to INV13 and the transmission gate TG11 depicted in FIG. 4. Moreover, in FIG. 6, transistors TR30 to TR32, nodes N33 and N34, and magnetoresistive elements MTJ31 and MTJ32 correspond to the transistors TR10 to TR12, the nodes N13 and N14, and the magnetoresistive elements MTJ11 and MTJ12 depicted in FIG. 4.

A control method for the control signals SR1 and SR2 and the CTRL in the store mode and the restore mode is exactly the same as that in the example of the first embodiment.

The conductance reduction accompanying an increase of a source potential of the transistor TR33 (or transistor TR34) occurs during store operation since the transistors TR33 and TR34 are the nMOS transistors, compared with the example of the first embodiment. However, the memory circuit is advantageously, structurally immune to the latch failure during the store operation similarly to the example of the first embodiment.

Fourth Embodiment

<Example of Configuration of NVDFF>

Figure 7:
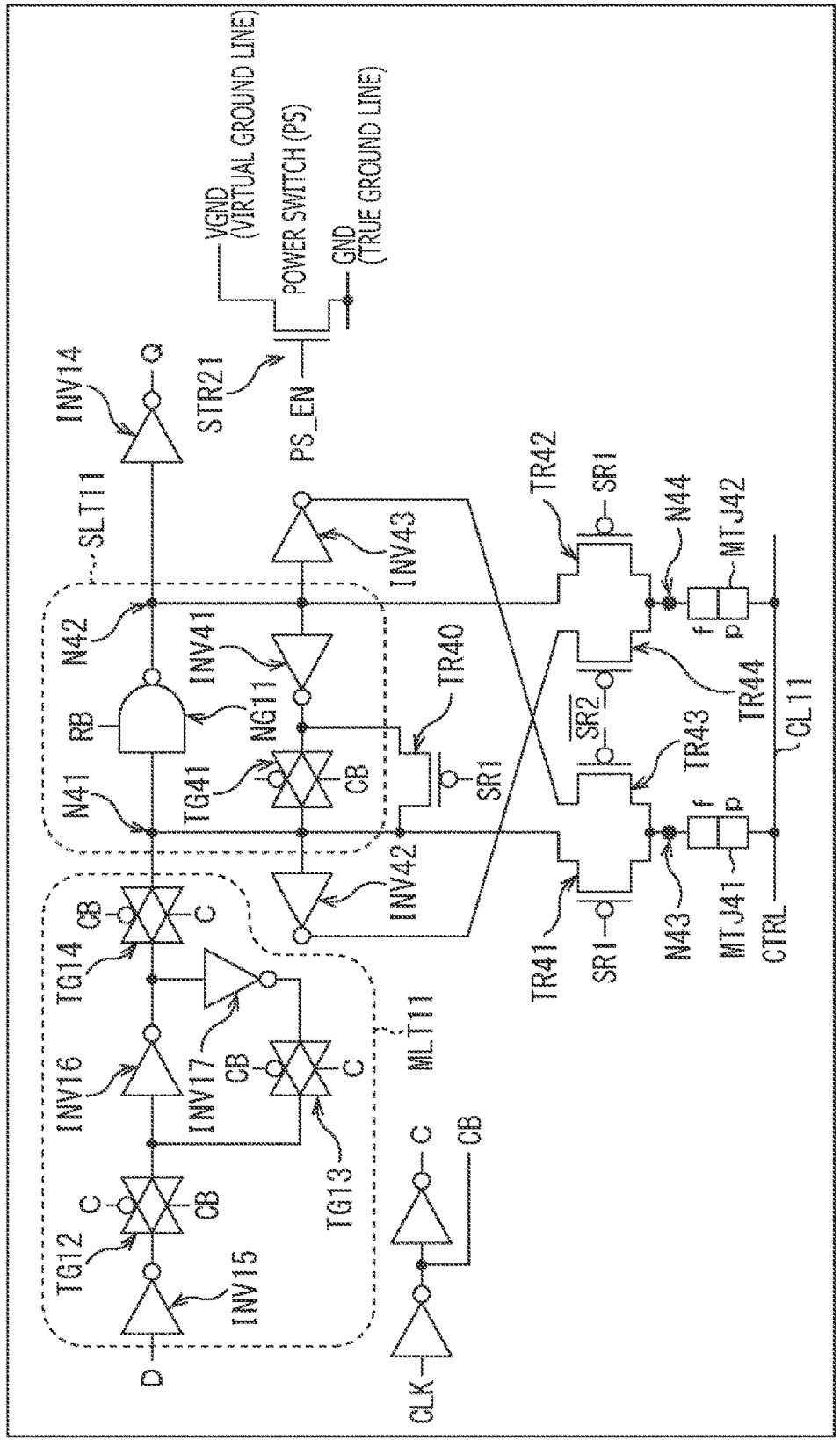
FIG. 7 depicts an example of a configuration of an NVDFF.

FIG. 7 depicts an example of a configuration of a fourth embodiment to which the present technique is applied. In FIG. 7, corresponding parts to those in FIG. 5 are denoted by the same reference symbols and description thereof is omitted as appropriate.

A circuit configuration depicted in FIG. 7 is an example in which the nMOS transistor STR21 is used as the PS at a time of implementing the PG similarly to the example of the second embodiment depicted in FIG. 5. The example of the fourth embodiment differs from the example of the second embodiment only in that transistors TR43 and TR44 used during the store operation are each configured with a pMOS transistor.

In other words, the configuration of a circuit depicted in FIG. 7 is different from the configuration depicted in FIG. 5 in that the transistors TR43 and TR44 that are the pMOS transistors are provided as an alternative to the transistors TR23 and TR24, and is the same as that depicted in FIG. 5 in other respects. The signal obtained by inverting the control signal SR2 is supplied to gates of the transistors TR43 and TR44.

Furthermore, in FIG. 7, memory nodes N41 and N42 correspond to the memory nodes N21 and N22 in FIG. 5, and inverters INV41 to INV43 and a transmission gate TG41 correspond to the inverters INV21 to INV23 and the transmission gate TG21 depicted in FIG. 5. Moreover, in FIG. 7, transistors TR40 to TR42, nodes N43 and N44, and magnetoresistive elements MTJ41 and MTJ42 correspond to the transistors TR20 to TR22, the nodes N23 and N24, and the magnetoresistive elements MTJ21 and MTJ22 depicted in FIG. 5.

The control method for the control signals SR1 and SR2 and the CTRL in the store mode and the restore mode is exactly the same as that in the example of the second embodiment.

While the conductance reduction accompanying a decrease of a source potential of the transistor TR43 (or transistor TR44) occurs during store operation since the transistors TR43 and TR44 are the pMOS transistors, compared with the example of the second embodiment. However, the memory circuit is advantageously, structurally immune to the latch failure during the store operation similarly to the example of the second embodiment.

Fifth Embodiment

<Example of Configuration of SRAM Circuit>

Figure 8:
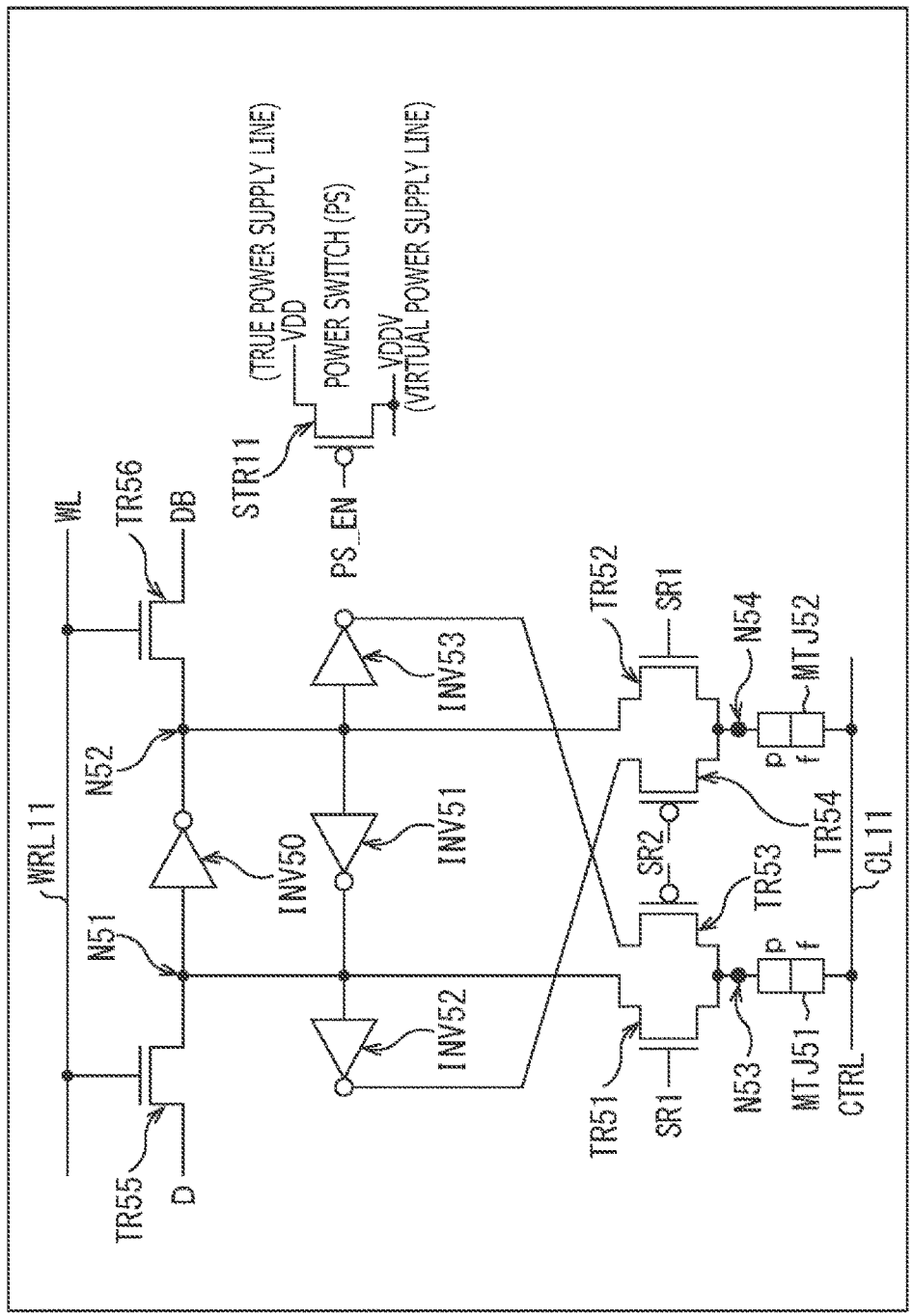
FIG. 8 depicts an example of a configuration of an SRAM (Static Random Access Memory) circuit.

FIG. 8 depicts an example of a configuration of a fifth embodiment to which the present technique is applied.

A circuit configuration depicted in FIG. 8 is an example in which the present technique is applied not to a DFF circuit but to an SRAM circuit to configure a non-volatile memory. In FIG. 8, corresponding parts to those in FIG. 4 are denoted by the same reference symbols and description thereof is omitted as appropriate.

A case in which the pMOS transistor STR11 is used as the PS at a time of implementing the PG is assumed. Two inverters INV50 and INV51 form an inverter loop, values of memory nodes N51 and N52 of memory cells are read out to bit lines (D and DB) via transistors TR55 and TR56 that are respective access transistors when a value of a control line WRL11 that is a word line WL is "1."

In the example depicted in FIG. 8, the inverters INV50 and INV51 and transistors TR55 and TR56 constitute memory cells of an SRAM circuit that is a volatile memory circuit. Furthermore, the transistors TR55 and TR56 are each configured with an nMOS transistor and gates of the transistors are connected to the control line WRL11.

The memory nodes N51 and N52 of the memory cells are connected to inverters INV52 and INV53, and outputs therefrom are connected to magnetoresistive elements MTJ52 and MTJ51 via pMOS transistors TR54 and TR53, respectively.

Furthermore, the memory nodes N51 and N52 of the memory cells are connected to the magnetoresistive elements MTJ51 and MTJ52 via transistors TR51 and TR52 that are nMOS transistors, respectively.

In this example, the memory nodes N51 and N52 correspond to the memory nodes N11 and N12 depicted in FIG. 4, and the inverters INV52 and INV53 connected to the memory nodes, the transistors TR51 to TR54, and the magnetoresistive elements MTJ51 and MTJ52 correspond to the inverters INV12 and INV13, the transistors TR11 to TR14, and the magnetoresistive elements MTJ11 and MTJ12 depicted in FIG. 4. Furthermore, nodes N53 and N54 correspond to the nodes N13 and N14 depicted in FIG. 4.

Free layers of the magnetoresistive elements MTJ51 and MTJ52 are connected to the control line CL11. Moreover, the control signal SR1 is supplied to gates of the transistors TR51 and TR52, and the control signal SR2 is supplied to gates of the transistors TR53 and TR54.

In the example depicted in FIG. 8, the control signals SR1 and SR2 are both set to "0," the transistors TR53 and TR54 that are pMOS transistors are turned on, and the transistors TR51 and TR52 that are nMOS transistors are turned off during store operation.

The CTRL line, that is, the CL11 is set to "0" and then changed to "1," whereby a write operation described in the example of the first embodiment is executed, and the magnetoresistive elements MTJ51 and MTJ52 are set into the P state or the AP state in response to logical values of the memory nodes N51 and N52.

During the restore operation, the control signals SR1 and SR2 are both set to "1," the transistors TR51 and TR52 that are the nMOS transistors are turned on, and the transistors TR53 and TR54 that are the pMOS transistors are turned off. The CTRL is set to "0."

When the PS is turned on, the restore operation described in the example of the first embodiment is executed, and voltages of the memory nodes N51 and N52 return to values before the sleep mode using a difference in the electrical resistance due to a difference in a magnetization state between the magnetoresistive elements MTJ51 and MTJ52.

Sixth Embodiment

<Example of Configuration of SRAM Circuit>

Figure 9:
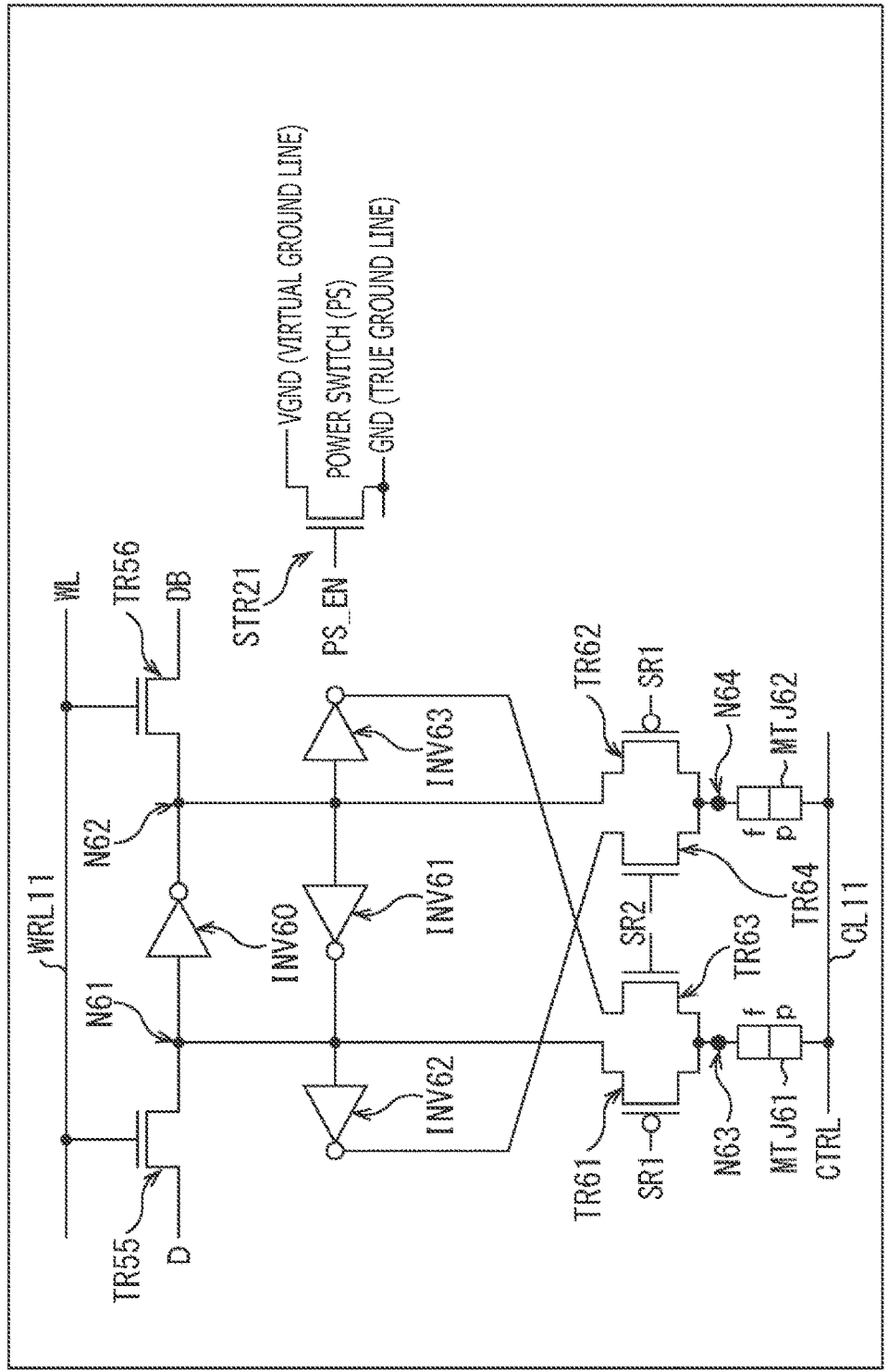
FIG. 9 depicts an example of a configuration of the SRAM circuit.

FIG. 9 depicts an example of a configuration of a sixth embodiment to which the present technique is applied.

A circuit configuration depicted in FIG. 9 is an example in which the present technique is applied to an SRAM circuit to configure a non-volatile memory, similarly to that depicted in FIG. 8. In FIG. 9, corresponding parts to those in FIG. 5 or FIG. 8 are denoted by the same reference symbols and description thereof is omitted as appropriate.

A case in which the nMOS transistor STR21 is used as the PS at a time of implementing the PG is assumed. Memory nodes N61 and N62 and inverters INV60 and INV61 correspond to the memory nodes N51 and N52 and the inverters INV50 and INV51 depicted in FIG. 8.

Furthermore, inverters INV62 and INV63, transistors TR61 to TR64, and magnetoresistive elements MTJ61 and MTJ62 correspond to the inverters INV22 and INV23, the transistors TR21 to TR24, and the magnetoresistive elements MTJ21 and MTJ22 depicted in FIG. 5. Moreover, nodes N63 and N64 correspond to the nodes N23 and N24 depicted in FIG. 5.

Pinned layers of the magnetoresistive elements MTJ61 and MTJ62 are connected to the control line CL11. Moreover, the control signal SR1 is supplied to gates of the transistors TR61 and TR62, and the control signal SR2 is supplied to gates of the transistors TR63 and TR64.

The memory nodes N61 and N62 of memory cells are connected to the inverters INV62 and INV63 and outputs therefrom are connected to the magnetoresistive elements MTJ62 and MTJ61 via the transistors TR64 and TR63 that are nMOS transistors, respectively.

Furthermore, the memory nodes N61 and N62 of the memory cells are connected to the magnetoresistive elements MTJ61 and MTJ62 via the transistors TR61 and TR62 that are pMOS transistors, respectively.

During the store operation, the control signals SR1 and SR2 are both set to "1," the transistors TR63 and TR64 that are the nMOS transistors are turned on, and the transistors TR61 and TR62 that are the pMOS transistors are turned off.

The CTRL line, that is, the CL11 is set to "1" and then changed to "0," whereby the write operation described in the example of the second embodiment is executed, and the magnetoresistive elements MTJ61 and MTJ62 are set into the P state or the AP state in response to logical values of the memory nodes N61 and N62.

During the restore operation, the control signals SR1 and SR2 are both set to "0," the transistors TR61 and TR62 that are the pMOS transistors are turned on, and the transistors TR63 and TR64 that are the nMOS transistors are turned off. The CTRL is set to "1."

When the PS is turned on, the restore operation described in the example of the second embodiment is executed, and voltages of the memory nodes N61 and N62 return to values before the sleep mode using a difference in the electrical resistance due to a difference in a magnetization state between the magnetoresistive elements MTJ61 and MTJ62.

<Store Operation>

Figure 10:
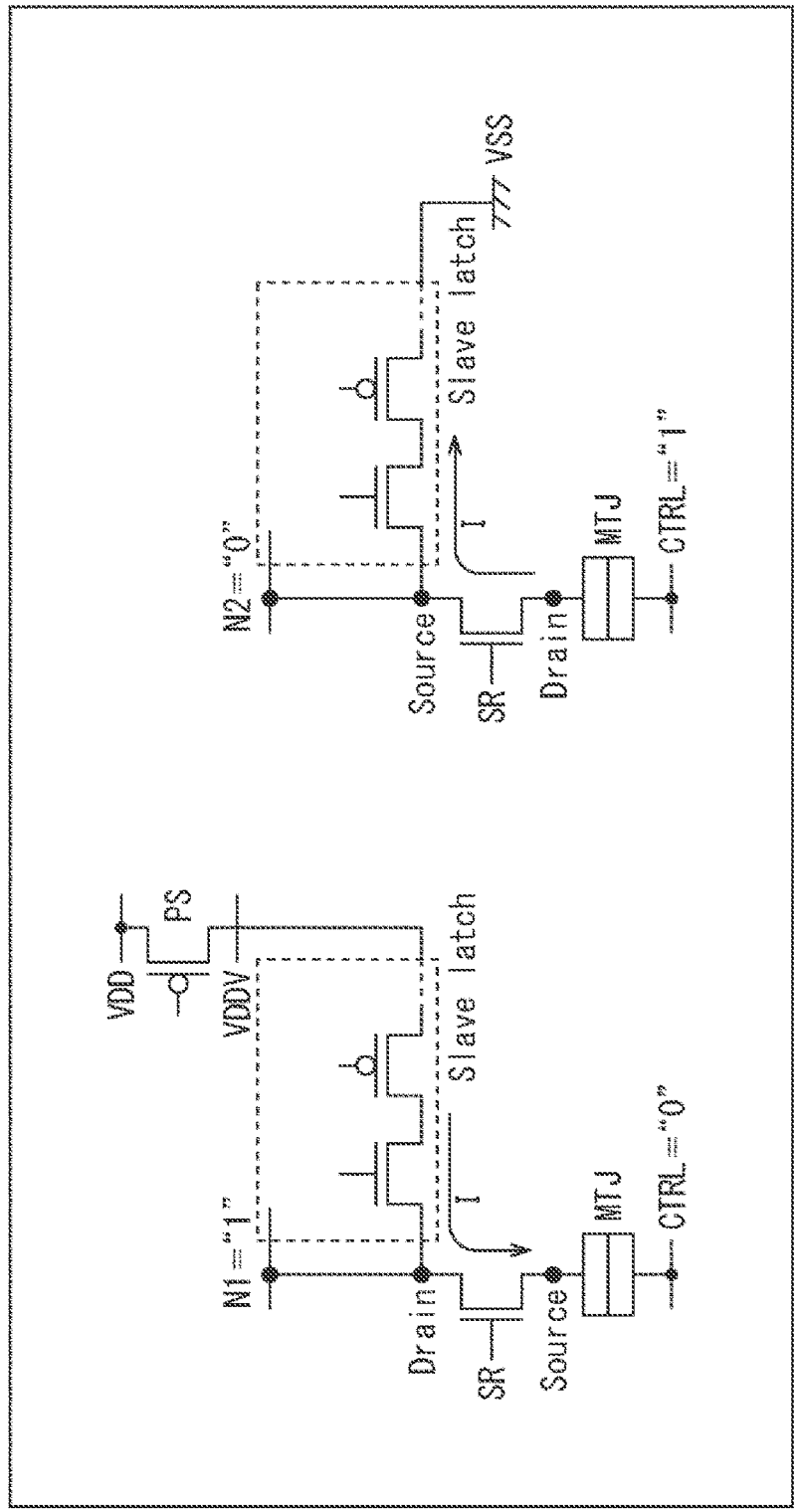
FIG. 10 is an explanatory diagram of a store operation of the NVFF.

Meanwhile, during the store operation of an NVFF (non-volatile flip-flop), as depicted in FIG. 10, a bidirectional current is carried from a VDD to the CTRL or from the CTRL to a VSS through an MTJ and transistors. Voltages of the nodes N1 and N2 are influenced by resistances of active transistors and a resistance of the MTJ. Further, the voltages of the nodes N1 and N2 change with a process fluctuation.

Such a change of the voltage value is controlled by a design restriction depicted in the following Expression (1).

$$R_{MTJ}+R_{SR}>>R_{logic} \quad (1)$$

In Expression (1), $R_{logic}$ indicates a resistance value in a current path from the VDD to an SR transistor, and $R_{SR}$ indicates a resistance value of the SR transistor. Furthermore, $R_{MTJ}$ indicates a resistance value of the MTJ.

If the NVFF does not satisfy Expression (1), then the voltages of the nodes N1 and N2 exceed a logical threshold and the slave latch is inverted. This is referred to as "Store-disturbance as 2nd issue." By contrast, by satisfying the restriction depicted in Expression (1), the resistance of the MTJ becomes higher than those of other parts. However, this causes an increase of sizes of the transistors and eventually an increase of a size of the NVFF.

Seventh Embodiment

<Example of Configuration of SSR-NVFF>

Figure 11:
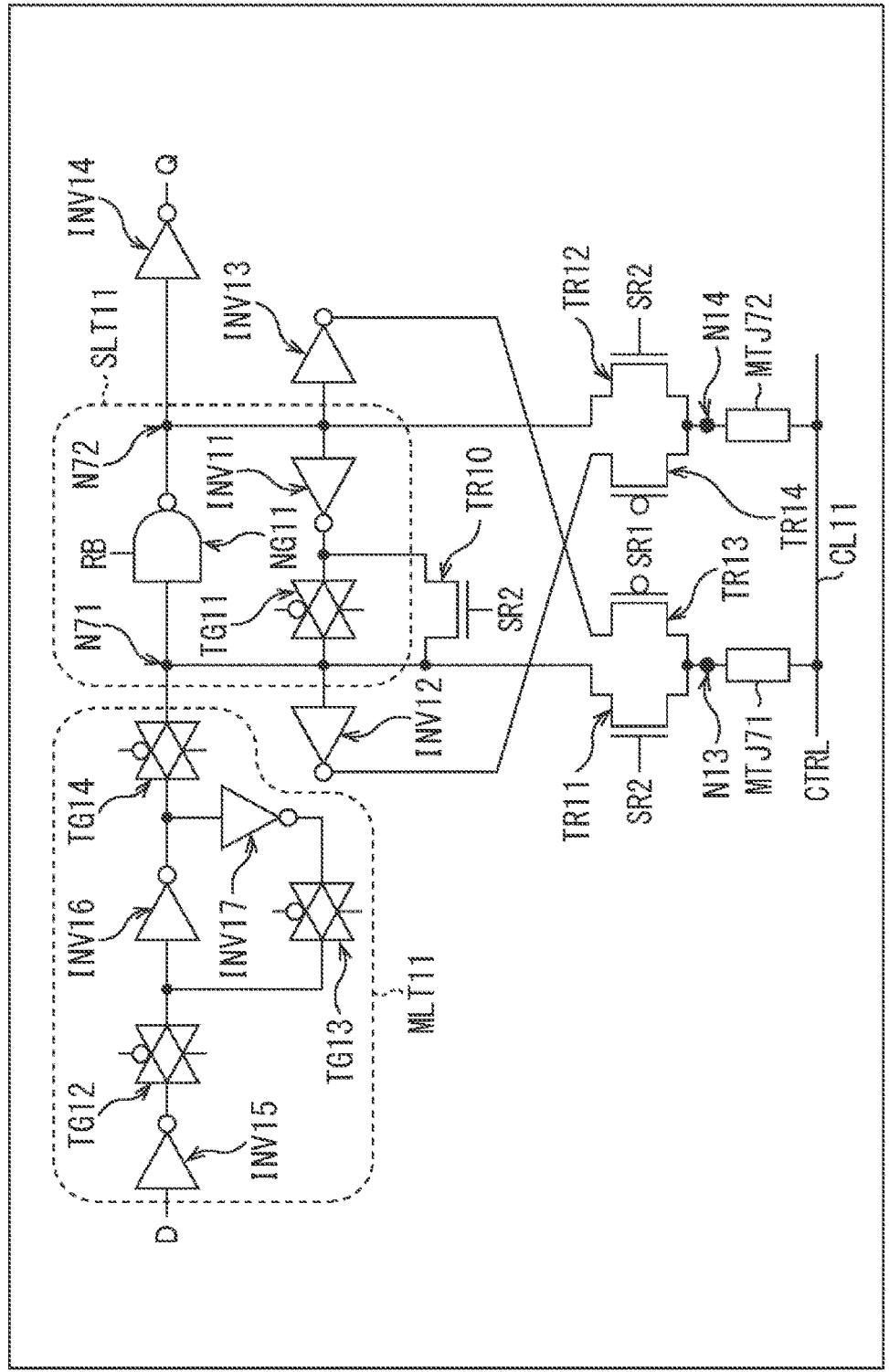
FIG. 11 depicts an example of a configuration of an SSR (Split Store/Restore)-NVFF.

FIG. 11 depicts an example of a configuration of a seventh embodiment to which the present technique is applied.

Figure 12:
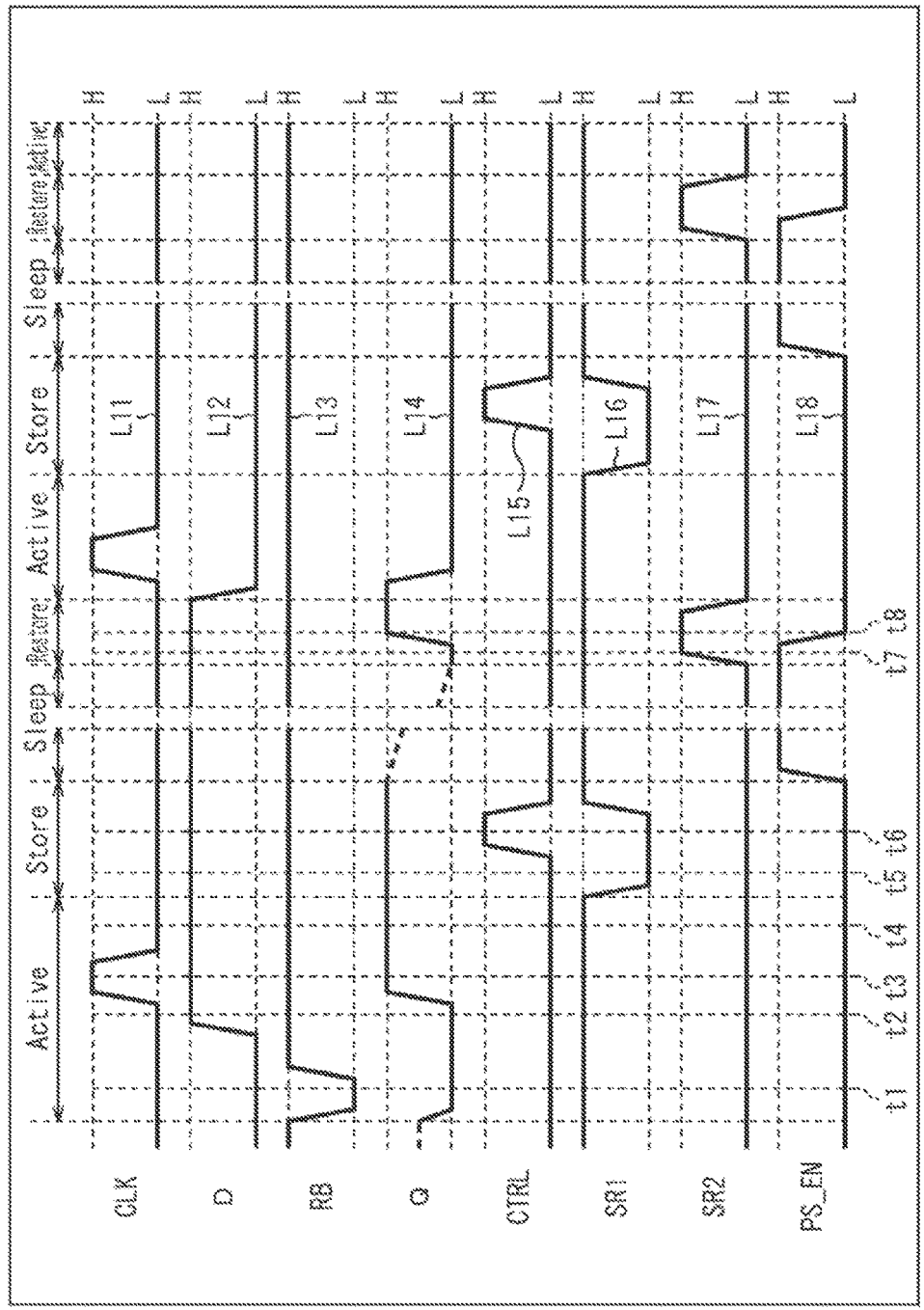
FIG. 12 is an explanatory diagram of an operation of the SSR-NVFF.

FIG. 11 depicts an example of a circuit configuration of an NVFF (SSR-NVFF) of an SSR (Split Store/Restore) structure. In FIG. 11, corresponding parts to those in FIG. 4 are denoted by the same reference symbols and description thereof is omitted as appropriate. FIG. 12 depicts a control sequence by the SSR-NVFF.

In FIG. 11, a configuration of the SSR-NVFF is such that six transistors are further added to an ordinary NVFF. Furthermore, magnetoresistive elements MTJ71 and MTJ72 are connected to the CTRL line.

A circuit configuration depicted in FIG. 11 is the same as the circuit configuration depicted in FIG. 4. In other words, memory nodes N71 and N72 depicted in FIG. 11 correspond to the memory nodes N11 and N12 depicted in FIG. 4, and the magnetoresistive elements MTJ71 and MTJ72 correspond to the magnetoresistive elements MTJ11 and MTJ12 depicted in FIG. 4. Therefore, free layers of the magnetoresistive elements MTJ71 and MTJ72 are connected to the control line CL11.

While the control signal SR2 is supplied to the gates of the transistors TR10 to TR12 in the example depicted in FIG. 11, the control signal SR1 is supplied to the transistors TR10 to TR12 in FIG. 4. However, the example depicted in FIG. 11 is the same as the example depicted in FIG. 4 in the control signal itself with only a difference in notation. Likewise, while the control signal SR1 is supplied to the gates of the transistors TR13 and TR14 in the example depicted in FIG. 11, the control signal SR2 is supplied to the transistors TR13 and TR14 in FIG. 4. However, the example depicted in FIG. 11 is the same as the example depicted in FIG. 4 in the control signal itself with only a difference in notation. Furthermore, FIG. 11 does not depict the pMOS transistor STR11.

A control sequence of the circuit depicted in FIG. 11 will next be described with reference to FIG. 12. In FIG. 12, a horizontal axis indicates time and a vertical axis indicates a level of each signal.

Further, line graphs L11 to L18 indicate the clock signal CLK, the stored data input to the master latch MLT11, the control signal RB, an output from the inverter INV14, a voltage of the control line CL11, the control signal SR1, the control signal SR2, and a control signal PS EN supplied to a gate of the pMOS transistor STR11. In these line graphs L11 to L18, a projecting upward state indicates a high level corresponding to the power supply voltage, that is, a state in which the value is "1," and a projecting downward state indicates a low level corresponding to 0 V, that is, a state in which the value is "0." It is noted that the control signal SR1 indicated by the line graph L16 is the control signal SR1 depicted in FIG. 11, and the control signal SR2 indicated by the line graph L17 is the control signal SR2 depicted in FIG. 11.

First, in the active mode, the control signal PS EN is set to the low level and the pMOS transistor STR11 is turned on. Furthermore, the control signal SR1 is set to "1" to turn off the transistors TR13 and TR14, and the control signal SR2 is set to "0" to turn off the transistors TR10 to TR12 as well.

In such a state, the control signal RB is set to "0" at time t1. By so setting, an output from the NAND gate NG11 becomes "1," the circuit is initialized, a value of the memory node N72 becomes "1," and a value of the memory node N71 becomes "0." Moreover, the output from the inverter INV14 becomes "0." While the control signal RB is then set to "1," the output from the NAND gate NG11 remains "1" in this state.

Next, at time t2, "1" is input to the master latch MLT11 as the stored data. At time t2, the clock signal CLK is in a low level state and the transmission gate TG12 is turned on, so that the input stored data "1" is inverted by the inverter INV15 to "0" and the data "0" is supplied to the inverter INV16 via the transmission gate TG12.

Next, at time t3 at which the clock signal CLK rises, the transmission gates TG13 and TG14 are turned on. Therefore, an output from the inverter INV16 becomes "1" by a loop configured with the inverters INV16 and INV17, and the output "1" is supplied to the memory node N71 via the transmission gate TG14 as the stored data. The output from the NAND gate NG11 thereby becomes "0," so that the output from the inverter INV14 is inverted from "0" to 1.

Subsequently, at time t4 at which the clock signal CLK falls, the transmission gates TG13 and TG14 are turned off and the transmission gates TG11 and TG12 are turned on. The stored data "1" is then stored in the memory node N71 by a loop configured with the inverter INV11 and the NAND gate NG11, and data "0" obtained by inverting the stored data "1" is stored in the memory node N72.

When the stored data input as described above is latched by the slave latch SLT11, toggling of the clock signal CLK is stopped.

Next, in the store mode, at time t5, the control signal SR1 is set to "0" and the transistors TR13 and TR14 are turned on.

An output from the inverter INV13 then becomes "1" since the data stored (retained) in the memory node N72 is "0."

At this time, since the value of the CTRL that is the control line CL11 is "0," a current is carried from the inverter INV13 to the control line CL11 through the transistor TR13 and the magnetoresistive element MTJ71 and the magnetoresistive element MTJ71 turns into the AP state. In other words, the data "0" stored in the memory node N72 is inverted and the inverted data is written to the magnetoresistive element MTJ71.

On the other hand, since the stored data stored in the memory node N71 is "1," an output from the inverter INV12 becomes "0." Since no current is carried to the transistor TR14 and the magnetoresistive element MTJ72 in this state, the magnetization reversal does not occur in the magnetoresistive element MTJ72.

Next, at time t6, when the value of the CTRL that is the control line CL11 is set to "1," then a current is carried from the control line CL11 to the inverter INV12 via the magnetoresistive element MTJ72 and the transistor TR14, and the magnetoresistive element MTJ72 turns into the P state since the output from the inverter INV12 is "0." In other words, the stored data "1" stored in the memory node N71 is inverted and the inverted data is written to the magnetoresistive element MTJ72. It is noted that no current is carried to the magnetoresistive element MTJ71 since the output from the inverter INV13 at this time is "1."

When the data of the memory nodes N71 and N72 is stored in the magnetoresistive elements MTJ72 and MTJ71 as described above, the value of the CTRL that is the control line CL11 is set to "0" and the store operation is finished.

In the sleep mode next to the store mode, the control signal PS EN is set to the high level, the pMOS transistor STR11 is turned off, and the power of the circuit is interrupted. An output side level of the inverter INV14 is thereby set to "0" as well.

Subsequently, at a time of return from the sleep state, the circuit operates in the restore mode.

In the restore mode, at time t7, the control signal SR2 is set to "1" and the transistors TR10, TR11, and TR12 are turned on. At this time, since the control signal SR1 is set to "1," the transistors TR13 and TR14 are kept being turned off. Furthermore, the value of the CTRL that is the control line CL11 is set to "0."

When the control signal PS EN is set to the low level and the pMOS transistor STR11 is turned on from such a state at time t8, the restore current is carried from the slave latch SLT11 to which the power supply voltage is supplied to the control line CL11 through the magnetoresistive elements MTJ71 and MTJ72.

In this example, the magnetoresistive element MTJ71 is in a state in which "1" is stored in the magnetoresistive element MTJ71 and the magnetoresistive element MTJ72 is in a state in which "0" is stored in the magnetoresistive element MTJ72, that is, the magnetoresistive element MTJ71 is in the AP state (high resistance state) and the magnetoresistive element MTJ72 is in the P state (low resistance state). Owing to this, when the restore current is carried, a voltage of the node N13 increases to be higher than a voltage of the node N14 due to a difference in the electrical resistance between the magnetoresistive elements MTJ71 and MTJ72.

Owing to this, the conductance reduction due to the increase of the source voltage occurs in the nMOS transistor TR11 more conspicuously than in the transistor TR12.

The current carried through the transistor TR11 thereby becomes lower than that carried through the transistor TR12 and the current difference between the transistors TR11 and TR12 is equal to or greater than the resistance difference between the magnetoresistive elements MTJ71 and MTJ72. As a result, a voltage of the memory node N71 increases to be higher than a voltage of the memory node N72, a positive feedback is applied in the loop configured with the inverter INV11 and the NAND gate NG11 within the slave latch SLT11, and the voltage of the memory node N71 returns to the power supply voltage, that is, the value of "1" and the voltage of the memory node N72 returns to 0 V, that is, the value of "0." The output side level of the inverter INV14 is thereby set to "1."

Subsequently, the operation in each of modes including the active mode, the store mode, the sleep mode, and the restore mode described so far is performed in response to the input stored data.

As described so far, according to the present technique, it is possible to obtain a non-volatile memory circuit ensuring a small size and low power consumption while maintaining stable write.

It is noted that the embodiments of the present technique are not limited to the abovementioned embodiments and various changes and modifications can be made without departure from the concept of the present technique.

Furthermore, the present technique can be configured as follows.

[1] A non-volatile memory circuit including:
a volatile memory unit configured to store information; and
a non-volatile memory unit to which the information stored in the volatile memory unit is written by a store operation, and from which the information is read out to the volatile memory unit by a restore operation, wherein a path during the store operation for the information differs from a path during the restore operation for the information between the volatile memory unit and the non-volatile memory unit.

[2] The non-volatile memory circuit according to [1], wherein
the volatile storage unit includes a first memory node and a second memory node,
the non-volatile memory unit includes a first memory element and a second memory element,
during the store operation, information retained in the first memory node is written to the second memory element via a first inverting element, and information retained in the second memory node is written to the first memory element via a second inverting element, and
during the restore operation, information retained in the first memory element is read out to the first memory node, and information retained in the second memory element is read out to the second memory node.

[3] The non-volatile memory circuit according to [2], wherein
the first memory element and the second memory element are magnetoresistive elements.

[4] The non-volatile memory circuit according to [2] or [3], wherein
the first memory node and the second memory element are connected to each other via the first inverting element and a first transistor, and
the second memory node and the first memory element are connected to each other via the second inverting element and a second transistor.

[5] The non-volatile memory circuit according to [4], wherein
the first memory node and the first memory element are connected to each other via a third transistor, and
the second memory node and the second memory element are connected to each other via a fourth transistor.

[6] The non-volatile memory circuit according to [5], wherein
during the store operation, the first transistor and the second transistor are turned on and the third transistor and the fourth transistor are turned off.

[7] The non-volatile memory circuit according to [5] or [6], wherein
during the restore operation, the first transistor and the second transistor are turned off and the third transistor and the fourth transistor are turned on.

[8] The non-volatile memory circuit according to any one of [5] to [7], wherein
the first transistor and the second transistor are positive metal oxide semiconductor transistors, and the third transistor and the fourth transistor are negative metal oxide semiconductor transistors.

[9] The non-volatile memory circuit according to any one of [5] to [7], wherein
the first transistor and the second transistor are negative metal oxide semiconductor transistors, and the third transistor and the fourth transistor are positive metal oxide semiconductor transistors.

REFERENCE SIGNS LIST

TR11: Transistor
TR12: Transistor
TR13: Transistor
TR14: Transistor
INV11: Inverter
INV12: Inverter
INV13: Inverter
MTJ11: Magnetoresistive element
MTJ12: Magnetoresistive element

What is claimed is:
1. A non-volatile memory circuit comprising:
a volatile memory unit configured to store information; and
a non-volatile memory unit to which the information stored in the volatile memory unit is written by a store operation, and from which the information is read out to the volatile memory unit by a restore operation,
wherein a path during the store operation for the information differs from a path during the restore operation for the information between the volatile memory unit and the non-volatile memory unit,
wherein the volatile memory unit includes a first memory node and a second memory node,
wherein the non-volatile memory unit includes a first memory element and a second memory element,
wherein, during the store operation, information retained in the first memory node is written to the second memory element via a first inverting element, and information retained in the second memory node is written to the first memory element via a second inverting element,
wherein, during the restore operation, information retained in the first memory element is read out to the first memory node, and information retained in the second memory element is read out to the second memory node,
wherein the first memory element and the second memory element are magnetoresistive elements,
wherein the first memory node and the second memory element are connected to each other via the first inverting element and a first transistor, wherein the second memory node and the first memory element are connected to each other via the second inverting element and a second transistor, wherein the first memory node and the first memory element are connected to each other via a third transistor, wherein the second memory node and the second memory element are connected to each other via a fourth transistor, and wherein, during the store operation, the first transistor and the second transistor are turned on and the third transistor and the fourth transistor are turned off.

2. A non-volatile memory circuit comprising:

a volatile memory unit configured to store information; and a non-volatile memory unit to which the information stored in the volatile memory unit is written by a store operation, and from which the information is read out to the volatile memory unit by a restore operation, wherein a path during the store operation for the information differs from a path during the restore operation for the information between the volatile memory unit and the non-volatile memory unit, wherein the volatile memory unit includes a first memory node and a second memory node, wherein the non-volatile memory unit includes a first memory element and a second memory element, wherein, during the store operation, information retained in the first memory node is written to the second memory element via a first inverting element, and information retained in the second memory node is written to the first memory element via a second inverting element, wherein, during the restore operation, information retained in the first memory element is read out to the first memory node, and information retained in the second memory element is read out to the second memory node, wherein the first memory element and the second memory element are magnetoresistive elements, wherein the first memory node and the second memory element are connected to each other via the first inverting element and a first transistor, wherein the second memory node and the first memory element are connected to each other via the second inverting element and a second transistor, wherein the first memory node and the first memory element are connected to each other via a third transistor, wherein the second memory node and the second memory element are connected to each other via a fourth transistor, and wherein during the restore operation, the first transistor and the second transistor are turned off and the third transistor and the fourth transistor are turned on.

3. The non-volatile memory circuit according to claim 2, wherein the first transistor and the second transistor are positive metal oxide semiconductor transistors, and the third transistor and the fourth transistor are negative metal oxide semiconductor transistors.

4. A non-volatile memory circuit comprising:

a volatile memory unit configured to store information; and a non-volatile memory unit to which the information stored in the volatile memory unit is written by a store operation, and from which the information is read out to the volatile memory unit by a restore operation, wherein a path during the store operation for the information differs from a path during the restore operation for the information between the volatile memory unit and the non-volatile memory unit, wherein the volatile memory unit includes a first memory node and a second memory node, wherein the non-volatile memory unit includes a first memory element and a second memory element, wherein, during the store operation, information retained in the first memory node is written to the second memory element via a first inverting element, and information retained in the second memory node is written to the first memory element via a second inverting element, wherein, during the restore operation, information retained in the first memory element is read out to the first memory node, and information retained in the second memory element is read out to the second memory node, wherein the first memory element and the second memory element are magnetoresistive elements, wherein the first memory node and the second memory element are connected to each other via the first inverting element and a first transistor, wherein the second memory node and the first memory element are connected to each other via the second inverting element and a second transistor, wherein the first memory node and the first memory element are connected to each other via a third transistor, wherein the second memory node and the second memory element are connected to each other via a fourth transistor, and wherein the first transistor and the second transistor are negative metal oxide semiconductor transistors, and the third transistor and the fourth transistor are positive metal oxide semiconductor transistors.

5. The non-volatile memory circuit according to claim 1, wherein the first transistor and the second transistor are positive metal oxide semiconductor transistors, and the third transistor and the fourth transistor are negative metal oxide semiconductor transistors.

6. The non-volatile memory circuit according to claim 1, wherein during the restore operation, the first transistor and the second transistor are turned off and the third transistor and the fourth transistor are turned on.

7. The non-volatile memory circuit according to claim 1, wherein the first transistor and the second transistor are negative metal oxide semiconductor transistors, and the third transistor and the fourth transistor are positive metal oxide semiconductor transistors.

8. The non-volatile memory circuit according to claim 2, wherein the first transistor and the second transistor are negative metal oxide semiconductor transistors, and the third transistor and the fourth transistor are positive metal oxide semiconductor transistors.

* * * * *